United States Patent [19]

Minakuchi

[11] 4,277,754
[45] Jul. 7, 1981

[54] DIGITAL FREQUENCY-PHASE COMPARATOR

[75] Inventor: Hiroshi Minakuchi, Kodoma, Japan

[73] Assignee: Matsushita Electric Industrial Co., Ltd., Osaka, Japan

[21] Appl. No.: 87,370

[22] Filed: Oct. 23, 1979

[51] Int. Cl.³ .................................... H03D 13/00
[52] U.S. Cl. ............................ 328/133; 307/514; 307/525
[58] Field of Search ............ 328/133, 134; 307/232, 307/233

[56] References Cited

U.S. PATENT DOCUMENTS

| | | | |
|---|---|---|---|
| 3,382,376 | 5/1968 | Sowden | 307/233 |
| 3,610,954 | 10/1971 | Treadway | 307/232 |
| 3,750,035 | 7/1973 | Crow | 328/133 |
| 3,755,746 | 8/1973 | Hogue et al. | 328/133 |
| 3,755,747 | 8/1973 | Letosky | 328/133 |
| 4,051,440 | 9/1977 | Nelson et al. | 328/134 |

Primary Examiner—John S. Heyman
Attorney, Agent, or Firm—Pollock, Vande Sande & Priddy

[57] ABSTRACT

A digital frequency-phase comparator includes a bistable element responsive to first and second frequency input pulse signals for generating a phase error signal, a circuit which includes second and third bistable elements responsive only to the leading edge transition of the input pulse signals in the presence of the outputs from the first bistable element to generate frequency error signals, and a circuit which combines the phase and frequency error signals to provide a triple state output.

36 Claims, 35 Drawing Figures

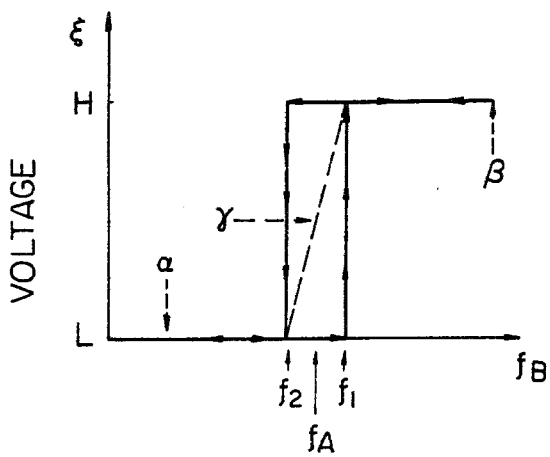
Fig. 3
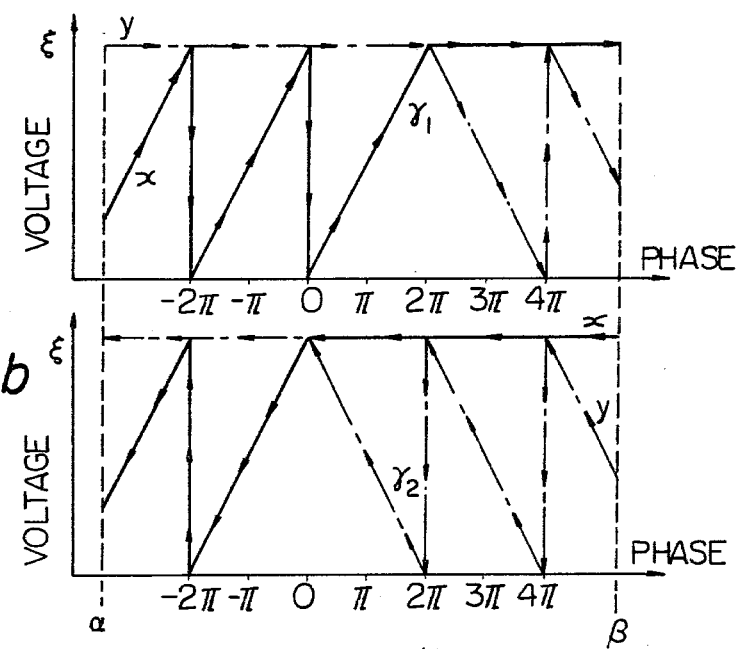
Fig. 4a
Fig. 4b

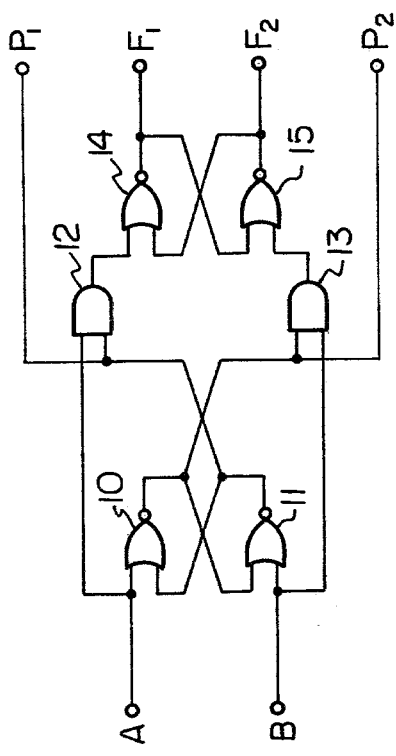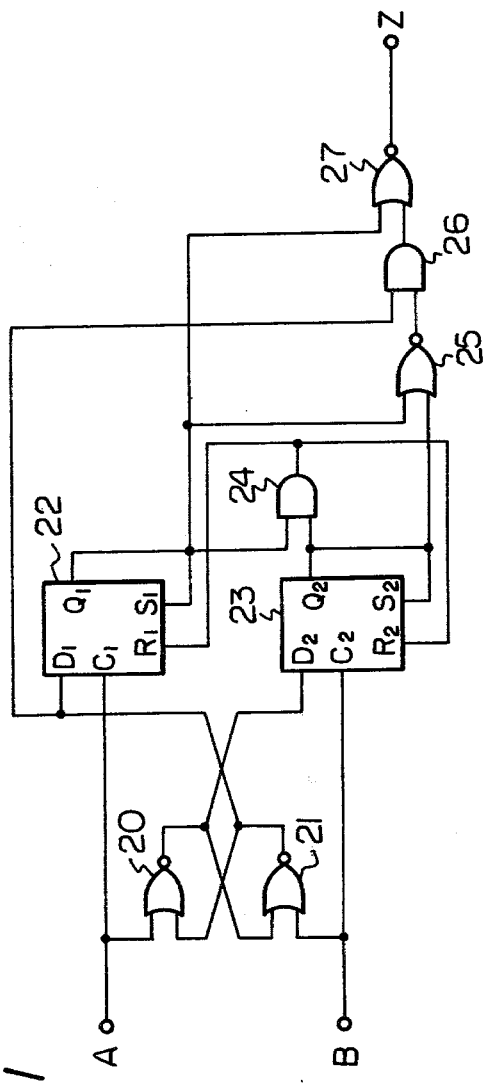
Fig. 9 PRIOR ART
Fig. 11

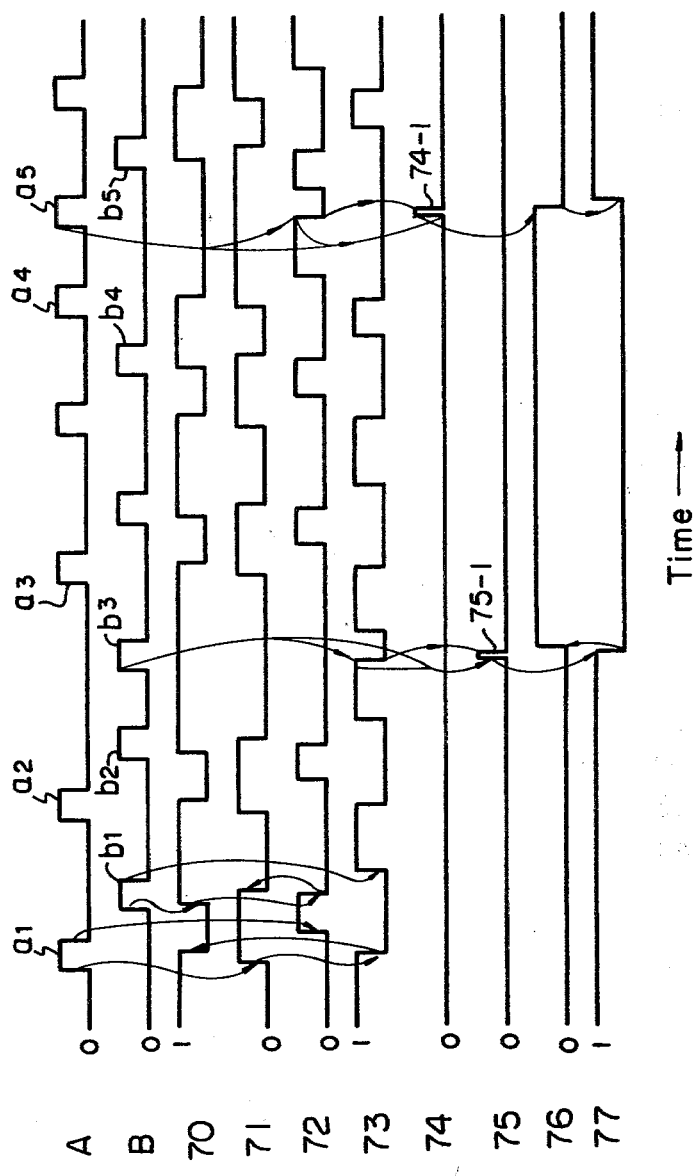

Fig. 24
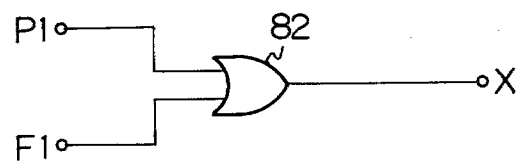
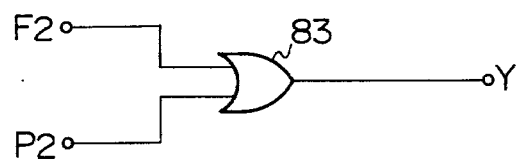
Fig. 25
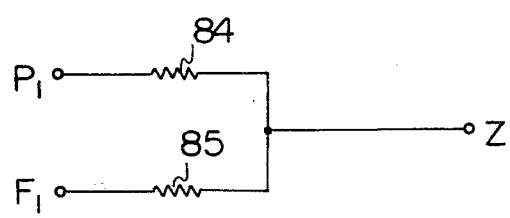

DIGITAL FREQUENCY-PHASE COMPARATOR

FIELD OF THE INVENTION

The present invention relates to a frequency-phase comparator which permits derivation of frequency and phase signals independently to allow the comparator to be employed in a phase-locked loop system.

DESCRIPTION OF THE PRIOR ART

U.S. Pat. No. 3,610,954 discloses a digital frequency-phase comparator which, as shown in FIG. 1, comprises a plurality of NAND gates interconnected to respond to changes in logic level of two input signals, the frequency/phase of which is compared. The comparator is responsive to changes in the trailing edges of the input waveforms and produces outputs that are related to the repetition rate and relative phase of the inputs. More specifically, the disclosed frequency-phase comparator includes first and second input coincidence gates each of which has a first input thereof supplied with a different one of two input signals, the phase and/or frequency of which is compared. The outputs of each of these input gates are connected to corresponding inputs of first and second output coincidence gates, the outputs of which are connected back to the second input of the first and second input coincidence gates, respectively. For controlling the operation of the logic system, a first pair of cross-coupled control coincidence gates is used, each control gate having first and second inputs and output. The second input of one of the control gates receives the output of the first input coincidence gate, and the output of that one of the control gates also is supplied to one of three inputs to the first output coincidence gate. A second pair of cross-coupled control coincidence gates is provided and these gates are interconnected in the same manner as the first pair of control gates, with the second input of one of the gates of the second pair being connected to the output of the second input coincidence gate and the output of that one of the control gates of the second pair is connected to a second input of the second output gate. The circuit is completed by a final control coincidence gate having four inputs which are obtained from each of the afore-mentioned inputs supplied to both of the first and second output gates. The output of this final control coincidence gate is supplied as a third input to both of the output coincidence gates and is supplied to the second inputs of the other one of the gates in each of the first and second pairs of cross-coupled coincidence gates. The comparator is responsive to the same signal transitions to effect the changing of states of the various gates used in the circuits. When one of the input signals has a higher frequency than the other, the corresponding output gate provides a pulse output which is repetitive at the lower frequency with the other output gate providing a constant DC level output. When both of the input signal frequencies are equal but differ in phase, the pulse width of one of the outputs is equal to the phase difference and occurs at the input frequency rate, while the other output is a constant DC level. The particular output providing the varying output signal depends upon which of the input signals of equal frequency and in phase, both of the output signals obtained from the output gates are at the same constant DC level.

Although the comparator of FIG. 1 will assure a wide capture range for a voltage controlled oscillator of a phase-locked loop system, it has a number of disadvantages.

Firstly, the phase and frequency error signals are not available independently from each other. For example, if the speed of an electric motor is controlled in response to a signal derived from a phase-locked loop system using a frequency generator connected to the motor so that the generator can be considered as constituting a lowpass filter and a voltage controlled oscillator, the starting of the motor would cause the motor to overshoot or undershoot because of the inertia of its rotor. If a high precision motor control is desired, a servo system would be employed which generates a signal which applies brake to the motor when it overshoots and a signal which accelerates the motor when it undershoots. In this instance, the comparator of FIG. 1 provides repetitive transitions of voltage level or a constant DC level through its output terminals. However, these signals cannot be directly used as a switching control signal for purposes of acceleration and deceleration of the motor because such control signal varies between two discrete levels during the time other than the acceleration and deceleration periods, and thus a lowpass filter is required to smooth out such varying signals. Since the lowpass filter includes a capacitor, the use of the latter in large numbers is undesirable when the system is fabricated on an integrated-circuit chip because the number of connecting leads would become substantial and its operation would become unreliable.

Although the comparator of FIG. 1 has a frequency discriminating feature, a large number of gates is required as compared with the phase comparator described in FIG. 3 of The Bell System Technical Journal, March 1962, pages 559–602 by C. J. Byrne, and additional gates are required to provide a separate phase error signal.

Secondly, if a charge pump circuit of FIG. 2 is connected to the output of the prior art frequency-phase comparator with the X and Y inputs of the charge pump circuit being connected respectively to the X and Y outputs of the comparator of FIG. 1 it appears that the signal at the output terminal Z of the charge pump will be at low constant DC level when the frequency of one of the inputs to the comparator is higher than the other and will be at high constant DC level when the frequency relation is reversed, and deliver a repetitive transitions of low and high voltage levels with a duty cycle proportitonal to the phase difference when the input signals are equal in frequency, thereby providing a triple state output (There are some articles which describe the operation of the above circuit combination as functioning to deliver a triple state output signal). However, so long as the above circuit is used in an open loop system, the output state of the terminal Z of the charge pump circuit is one of high and low constant DC levels, and no other signal is obtained.

More specifically, let it denote that the signals to the input terminals A and B of FIG. 1 as $f_A$ and $f_B$ respectively and assume that frequency $f_B$ is lower than frequency $f_A$ at a point $\alpha$ in the operating characteristic curve of FIG. 3, the output terminal of the FIG. 1 comparator is held at a constant high DC level with the result that the drain electrodes of MOSFETs 1 and 2 of FIG. 2 (which constitute an inverter circuit) become low to cause MOSFET 3 (which constitutes a steering gate) to turn off. At the X output of the FIG. 1 comparator there appears a train of repetitive transitions of high and low levels with the duty cycle related to the relative phase of the input signals to the frequency-phase comparator, so that upon a low level transition at terminal X, a p-channel enhancement MOSFET 4 is switched to an ON state causing an output gate n-channel enhancement MOSFET 5 to turn on so that the output termianl Z of the charge pump circuit of FIG. 2 goes low, and upon a high level transition at the same terminal X the MOSFET 4 is turned off. However, because of the presence of the constant high DC level at the Y terminal the drain electrode of the MOSFET 3 is held at a high impedance level, so that the carriers which have been accumulated in the gate region of the MOSFET 5 are not discharged causing it to remain in the ON state and thus the output terminal Z is still held at the low level.

Assuming that the input frequency $f_B$ increase gradually so that at a point $f_1$ of the coordinate axis $f_B$ of FIG. 3, a reversal of the output states of the terminals X and Y of FIG. 1 (that is, the X output terminal is then held at a constant high DC level and at the Y output terminal there appears a train of voltage level transitions when there are at least two leading edge transitions in the input terminal B during the interval between two leading edge transitions of the signal to the input terminal A of FIG. 1).

Upon the presence of the constant low DC level at the terminal Y, the p-channel MOSFET 1 is switched to an ON state causing MOSFET 3 to turn on to allow the carriers accumulated in the gate region of the MOSFET 5 to discharge and a p-channel MOSFET 6 to turn on so that the output terminal Z is switched to a high DC level.

In summary, when frequency $f_B$ increases from the point $\alpha$ until a point $\beta$ in FIG. 3, the average signal level $\xi$ at both terminals X and Y adopts curves x and y of FIG. 4a. However, the combined signal from the output of the charge pump circuit of FIG. 2 undergoes a rapid change in level from low to high when frequenc $f_B$ coincidense with $f_1$, so that it is impossible to derive a phase error signal when the frequency $f_B$ increases from the points $\alpha$ to $\beta$.

Conversely, when frequency $f_B$ is gradually decreased from the point $\beta$ the output states of the terminals X and Y are reversed at a point $f_2$ where frequency $f_B$ becomes lower than frequency $f_A$ (that is, there are at least two leading edge transitions in the input terminal A during the interval between two leading edge transitions at the input terminal B) and as a result the average level of the output signal from terminal X adopts a sawtooth curve, while the average level of the output signal from terminal Y is held at a constant high DC level as illustrated in FIG. 4b.

Therefore, at the point $f_2$ in FIG. 3 the output level of terminal Z of FIG. 2 undergoes a rapid transition from high to low levels, so that it is impossible to deliver a phase error signal as the frequency $f_B$ decreases with respect to frequency $f_A$. It is thus appreciated that so long as the frequency-phase comparator of FIG. 1 is used in conjunction with a charge pump circuit in an open loop system it is impossible to derive an output signal which represents the phase difference between two input signals applied to the comparator.

If the combination of the above-mentioned comparator and charge pump circuit having such open loop operating characteristics is employed in a phase-locked loop system as illustrated in FIG. 5, it is ascertained that the output signal from the voltage controlled oscillator 8 contains a jitter component whose frequency is one-half the fundamental frequency of the loop when capacitor 7 of the lowpass filter is chosen at a value close to zero, and in this instance the output from the charge pump circuit 9 is a phase error signal of which the frequency is one-half of the fundamental frequency and the average signal level adopts a curve as indicated by $\gamma$ in FIG. 3. This phenomenon can be explained in more detail with reference to FIGS. 4a and 4b. With the output terminal Z being at a low DC level when frequency $f_B$ corresponds to $\gamma_1$ in FIG. 4a, the phase-locked loop system operates such that the output frequency of the voltage controlled oscillator 8 increases, so that after passing through the frequency point $f_1$ the frequency $f_B$ reaches $\gamma_2$ in FIG. 4b whereupon the output terminal X is driven to a high DC level by an output signal from the Y terminal. With the Z terminal being at the high DC level, the phase-locked loop operates in such a way that the output frequency of the VCO 8 decreases, and after passing through the frequency point $f_2$, frequency $f_B$ now returns to $\gamma_1$ of FIG. 4a and the Z output terminal is driven to a low DC level by an output signal from the X terminal. This process is repeated with the result that the output signal from the VCO 8 contains the jitter component as described above.

This phenomenon is not avoidable as long as the frequency-phase comparator or charge pump circuit having an output characteristic shown in FIG. 3 is employed to constitute a phase-locked loop system, although an increase in the capacitive element of the lowpass filter or a high quality lowpass filter may serve to improve the jitter problem at the expense of the response characteristic and the carrier-to-noise ratio of the loop.

As far as the loop's response and carrier-to-noise ratio are concerned, these characteristics can be improved witht an improvement over the comparator of FIG. 1 and the charge pump circuit of FIG. 2. Since the factor that contributes to the degradation of the carrier-to-noise ratio of the system of FIG. 5 resides in the fact that the charge pump circuit 9 has such an output characteristic as shown in FIG. 3, the use of a charge pump circuit as shown in FIG. 6 which is disclosed in U.S. Pat. No. 3,748,589 or the use of a two resistor network having equal resistances inserted in the source and drain electrodes of the MOSFETs 4 and 3 of the charge pump circuit of FIG. 2 will result in an output characteristic as shown in FIG. 7. Alternatively, by feeding the output signals from the X and Y terminals of the FIG. 1 comparator directly to a lowpass filter the output characteristic x or y of FIG. 4a may be obtained and in either case the jitter component of the signal from the VCO 9 is drastically reduced.

However, the characteristic of FIG. 7 still falls short of the ideal characteristic of a phase-locked loop system as shown in FIG. 8 in terms of system response and capture range.

U.S. Pat. No. 3,069,623 discloses a frequency comparator as shown in FIG. 9 using two set-rest flip-flop circuits and two coincidence gates to provide phase and frequency error signals from output terminals P1, P2, F1 and F2. Application of trains of input pulses as indicated by solid lines in FIGS. 10a and 10b respectively to the input terminals A and B of FIG. 9 will result in output waveforms from NOR gates 10, 11, and gates 12, 13, and NOR gates 14, 15, as shown in solid lines in FIGS. 10c to 10h. More specifically, the presence of two or more leading edge transitions in the pulse train applied to terminal A during the interval between two leading edge transitions in the pulse train applied to terminal B causes an output pulse 13-1 to appear from the AND gate 13 causing the NOR gate 15 to go low and as a result the output of the NOR gate 14 undergoes a low-to-high level transition. Conversely, the presence of two or more leading edge transition in the pulse train applied to terminal B during the interval between two leading edge transitions in the pulse train applied to terminal A results in an output pulse 12-1 from the AND gate 12, causing the NOR gate 14 to go low and hence the NOR gate 15 to go high. Therefore the binary state of the bistable device, comprised by the cross-coupled NOR gates 14 and 15, is an indication of which input frequency is higher or lower than the other.

However, the frequency-phase comparator of FIG. 9 does not satisfactorily operate if the pulse duration of the input train is exeeds a certain limit as shown in broken lines in FIGS. 10a and 10b. This will be explained with reference to the waveforms shown in broken lines with reference to FIGS. 10a, 10b, 10e, 10f, 10i and 10j. Assume that NOR gates 10 and 15 are initially at high DC level and NOR gates 11 and 14 are initially at low DC level. Application of a positive pulse indicated by broken lines a1 to the input terminal A will cause NOR gate 10 to develop a low level output by the leading edge of the applied pulse a1 after the delay response time of that gate and cause NOR gate 11 to go high at a point in time elapsed by the delay response time of NOR gate 11, so that the high level condition at terminal A in the presence of the high output level of the NOR gate 11 results in an output pulse indicated by broken lines 12-2 from the AND gate 12. Since NOR gate 14 is in the low output state at the instant the AND gate 12 delivered the pulse 12-2, the binary state of the NOR gate 14 and hence the NOR gate 15 remains unchanged. However, application of an input pulse indicated by broken lines b1 to the terminal B will cause AND gate to go high producing a pulse 13-2 which in turn triggers NOR gates 15 to go into a low output state and then NOR gate 14 to go into high output state as shown in FIGS. 10i and 10j. Thereafter, the NOR gates 14 and 15 are alternately caused to change their binary states in response to alternate applications of the input pulses to terminals A and B. Therefore, the binary states of the NOR gates 14 and 15 no longer represent the frequency difference between the two input signals. It is apparent from the above that in order for the circuit of FIG. 9 to operate satisfactorily the pulse duration (the interval between the leading and trailing edge transitions of each input pulse) must be less than the equivalent delay response times of two cascaded gates.

The aforesaid U.S. Pat. No. 3,069,623 discloses the use of a differentiator circuit for generating trains of short-duration input pulses. However, it is usually difficult to generate pulses with the duration narrower than the two-gate response time with the use of the conventional RC differentiator circuit, and even assuming that such narrow pulses are possible there would result in a failure to drive the gates because of the small input power.

SUMMARY OF THE INVENTION

An object of the invention is to provide a frequency-phase comparator which permits derivation of frequency and phase error signals independently from each other.

Another object of the invention is to provide a frequency-phase comparator which elimitates the aforesaid prior art disadvantages by the use of a circuit which logically ensures the derivation of frequency and phase error signals in the presence of relatively long duration input pulses by exclusively responding to the leading edge transition of the input pulses and by the use of two bistable elements for generating a triple state output signal signifying the frequency difference error by two different binary levels and by rectangutlar pulses when the input frequency are equal but differ in phase.

BRIEF DESCRIPTION OF THE DRAWINGS

The invention will be further described by way of example with reference to the accompanying drawings, in which:

FIG. 3 is an explanatory graphic illustration associated with the circuits of FIGS. 1 and 2;

FIGS. 4a and 4b are explanatory graphic illustrations associated with the circuit of FIG. 1;

FIG. 9 is a circuit diagram of another prior art frequency-phase comparator;

FIG. 11 is a circuit diagram of a first embodiment of the invention;

FIG. 22 is a waveform diagram associated with the circuit of FIG. 21;

FIGS. 24 and 25 are illustrations of combining networks used in conjunction with the circuits of FIGS. 19, 21 and 23;

DETAILED DESCRIPTION

Figure 1:
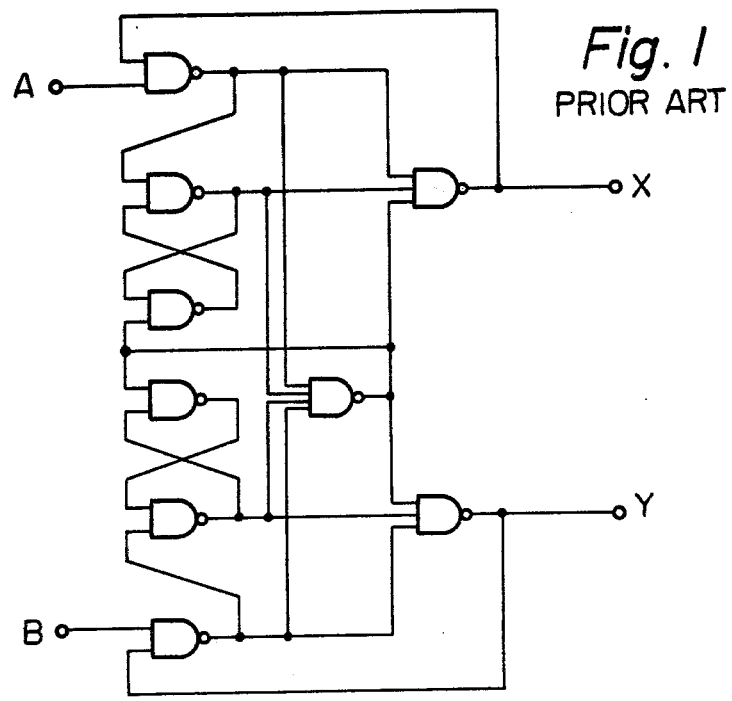
FIG. 1 is a circuit diagram of a prior art frequency-phase comparator.
Figure 2:
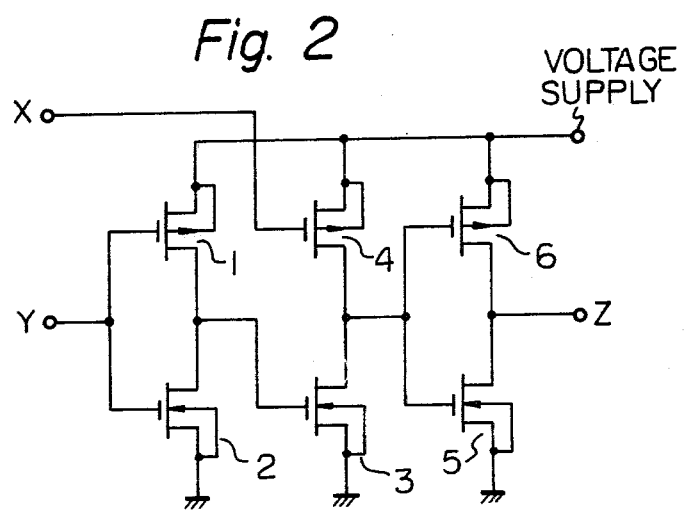
FIG. 2 is a circuit diagram of a charge pump circuit.
Figure 5:
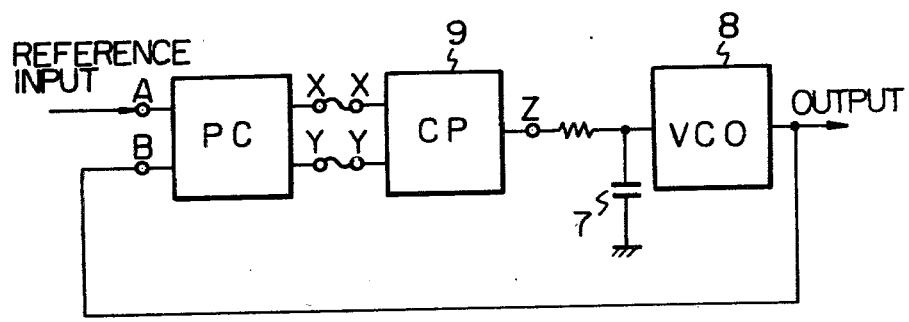
FIG. 5 is a block diagram of a phase-locked loop system.

Referring now to FIG. 11, a first preferred embodiment of the present invention is illustrated as comprising a bistable device comprised by a pair of NOR gates 20 and 21 which are cross-coupled so that the output of each is connected to an input of the other, the other input of NOR gates 20 and 21 being connected to input terminals A and B, respectively. The output of the NOR gate 21 is further connected to the delayed input terminal D1 of a D-type flip-flop 22 whose output Q1 is connected to an input of an AND gate 24 and the output of the NOR gate 20 is further connected to the delayed input of a D-type flip-flop 23 whose output is connected to another input of the AND gate 24. The output of the AND gate 24 is used to reset the flip-flops 22 and 23 through their reset terminals R1 and R2, respectively. The flip-flop 22 changes its binary state of the Q1 output to the binary state of the data input D1 in response to the leading edge transition of an input pulse applied to its clock input C1 connected to the terminal A. Similarly, the flip-flop 23 changes its binary state of the Q2 output to the binary state of the delayed input D2 in response to the leading edge transition of an input applied to its clock input C2 connected to the terminal B. The flip-flop 22 constitutes with its D1, C1 inputs and Q1 output a first frequency difference detector to provide a high level output indicating that the signal on terminal A is higher in frequency than the signal on terminal B, while the flip-flop 23 constitutes with its D2, C1 inputs and Q2 output a second frequency difference detector for providing a high level output indicating that the signal on terminal B is higher in frequency than the signal on terminal A. These D-type flip-flops remain in the high output state by a connection from the respective Q outputs to the respective set terminals (S1, S2). The Q1 and Q2 outputs of the flip-flops 22 and 23 are further connected through a NOR gate 25 to an input of an AND gate 26 which receives as its other signal a signal from the output of the NOR gate 21 and delivers a coincidence output to an input of a NOR gate 27 to the other input of which is supplied a signal from the Q1 output of flip-flop 22, the output of the NOR gate 27 being connected to an output terminal Z of the phase-frequency comparator.

Figure 12:
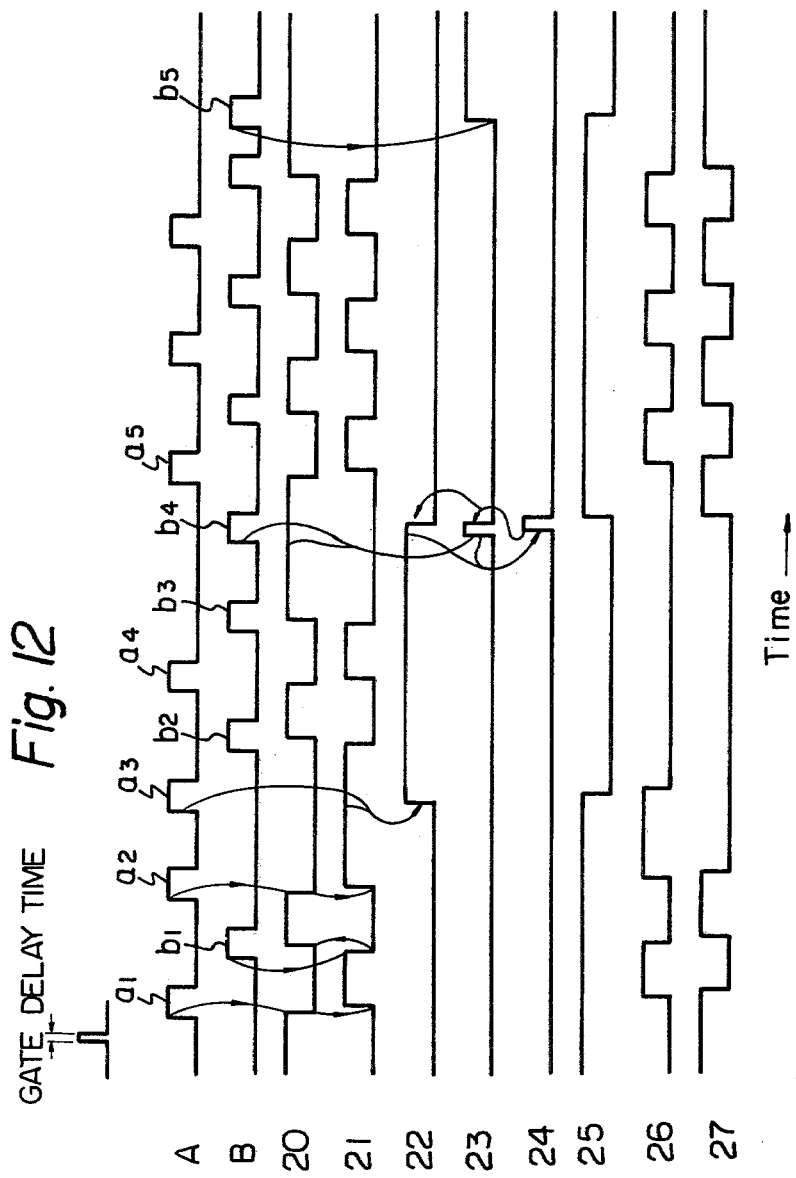
FIG. 12 is a waveform diagram associated with the circuit of FIG. 11.

The operation of the comparator of FIG. 11 is visualized with reference to the waveforms shown in FIG. 12. For purposes of illustration the waveforms of FIG. 12 are exaggerated to show rapid changes in the input frequencies. Assuming that the Q1 and Q2 outputs are low, application of an input pulse a1 to the terminal A causes the NOR gate 20 to go low and then the NOR gate 21 to go high by the leading edge transition of the pulse a1. In response to the leading edge transition of a pulse b1 on terminal B which follows the pulse a1, the NOR gate 21 is returned to the low level which causes the NOR gate 20 to go high. The NOR gate 20 then responds to the leading edge transition of a subsequent pulse a2 on terminal A by lowering its output level which in turn causes the NOR gate 21 to go high. The above process will be repeated as long as the pulses on the terminals A and B appear alternately, so that the output of either one of the NOR gates 20 and 21 is rectangular pulses whose duty cycle is proportional to the difference in phase between the two pulse trains and this phase error signal is coupled through the AND gate 26 when enabled to the NOR gate 27.

Assume that the frequency of the signal on terminal B is lowered so that a subsequent pulse a3 appears prior to the occurrence of a pulse b2 on terminal B, the flip-flop 22 is turned to a high DC level in response to the leading edge transition of the pulse a3. This condition will continue until the frequency of the signal on terminal B becomes higher than the frequency of the signal on terminal A. More specifically, when pulses b3 and b4 appear in succession between the leading edge transitions of pulses a4 and a5, the flip-flop 23 changes to a high output state in response to the leading edge transition of the pulse b4, so that AND gate 24 provides a coincidence output which resets the flip-flops 23 and 24 at the same time. If the signal on terminal B becomes higher in frequency than signal on terminal A, a pulse b5 will cause the flip-flop 23 to go into the high state which continues until the frequency of signal B becomes lower than signal A. Therefore, the high DC level at one of the outputs of the flip-flops 22 and 23 is an indication of the difference in frequency between the two input pulse trains and the low DC level at both the outputs of these flipf-flops is an indication that the input frequencies are equal.

Figure 8:
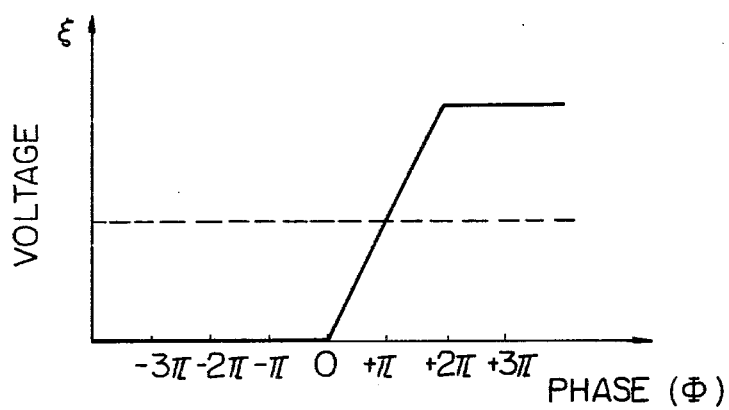
FIG. 8 is a graphic illustration of an idealized operating characteristic of a frequency-phase comparator.
Figure 10:
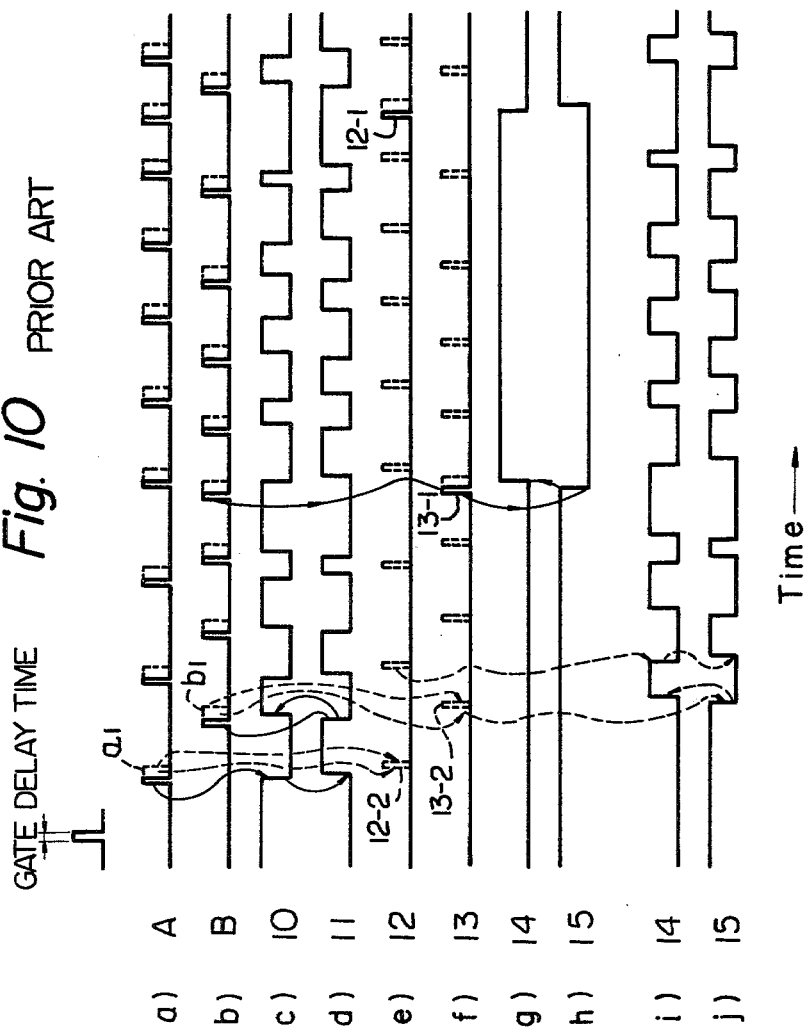
FIG. 10 is a waveform diagram associated with the circuit of FIG. 9.

Since the NOR gate 25 generates a high DC level output when both of its inputs are low, the high DC level condition of NOR gate 25 indicates that the two input signals are of the same frequency and enables the AND gate 26 to pass the phase error signal to the output NOR gate 27 which combines the phase error signal with the frequency error signal to produce a triple state output. As shown in FIG. 12, when the two input signals coincide in frequency the output from the NOR gate 27 is rectangular pulses with a duty cycle proportional to the phase difference and when the frequency of signal B is lower than signal A the NOR gate 27 output is a low DC level, and when the frequency of signal B is higher than signal A, a high DC level output is delivered from NOR gate 27. Therefore, the average output level of the signal at the terminal Z is identical to that shown in FIG. 8.

As seen from FIG. 12, the frequency-phase comparator of FIG. 11 is responsive exclusively to the leading edge transition of the input pulses, a lengthening of the input pulses produces no changes in the logical sequence of the comparator.

Obviously, it is also possible to employ the frequency-phase comparator of FIG. 11 in an open loop system provided with a circuit which allows the flip-flops 22 and 23 to be reset in response to a manual command signal.

Figure 13:
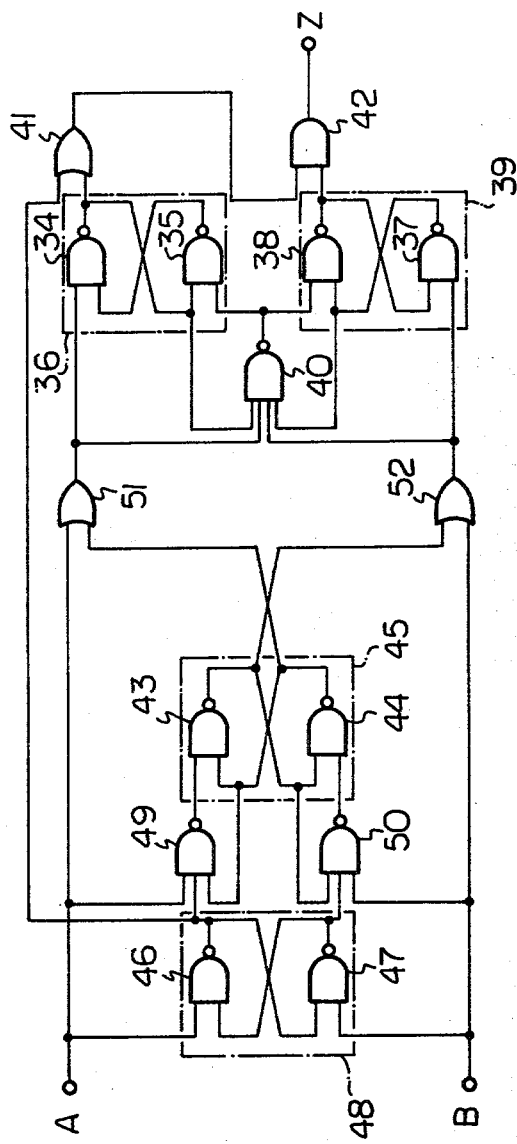
FIG. 13 is a modification of the FIG. 11 embodiment.

Alternative embodiment of the comparator of FIG. 11 is illustrated in FIG. 13 as comprising a frequency and phase detector circuit which is generally comprised of a bistable element 48, a pair of coincidence gates 49 and 50, a bistable element 45 and OR gates 51 and 52. The bistable element 48 comprises a pair of NAND gates 46 and 47 which are so cross-coupled that the output of each is connected to an input of the other, the other input of NAND gates 46 and 47 being connected to the input terminals A and B, respectively, to receive negative going input pulses applied thereto. The NAND gate 49 receives its inputs from the output of NAND gate 46, the input terminal A and from the output of NAND gate 44 of the bistable element 45 and delivers its output to an input of the NAND gate 43 whose output is connected to an input of NAND gate 44. The NAND gate 50 takes its inputs from the output of NAND gate 47, the input terminal B and from the output of NAND gate 43 to deliver an output to the other input of the NAND gate 44 whose output is connected to the other input of the NAND gate 43. The OR gate 51 takes its inputs from the input terminal A and from the output of the NAND gate 44, while the OR gate 52 takes its inputs from the output of the NAND gate 43.

Figure 14:
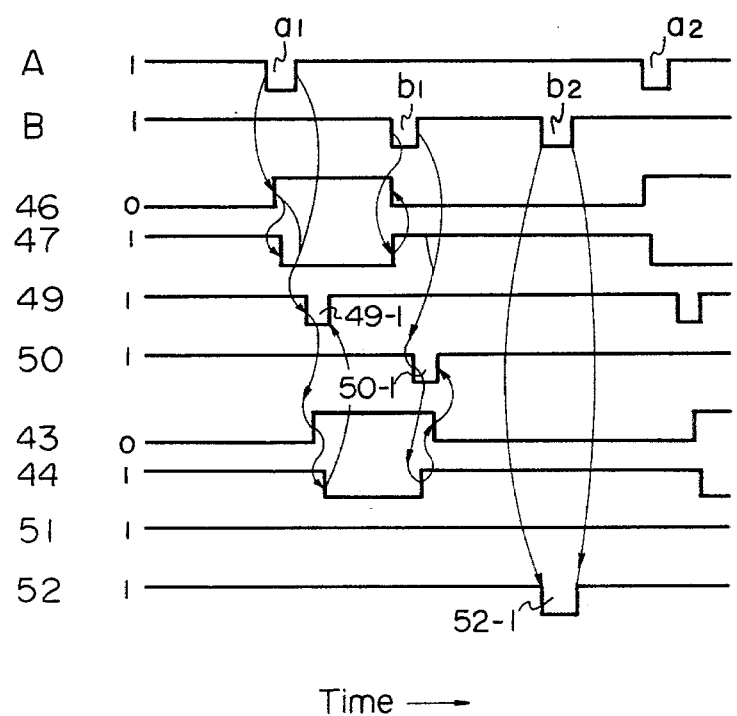
FIGS. 14 and 15 are waveform diagrams associated with the circuit of FIG. 13.

The operation of the frequency and phase detector circuit as described above is visualized with reference to the waveforms shown in FIG. 14. Assume that the outputs of NAND gates 46 and 47 are low and high DC levels, respectively, and the outputs of NAND gates 43 and 44 are low and high DC levels, respectively. By the leading edge transition of a negative going pulse a1 at the input terminal A, the NAND gate 46 is switched to a high output state which in turn causes NAND gate 47 to switch to a low level. In response to the trailing edge transition of pulse a1 the NAND gate 49 is switched to a low output level. Immediately following the negative edge transition of the output of NAND gate 49 (pulse 49-1), and NAND gates 43 and 44 successively change their binary states, so that in response to the negative edge transition of the output of NAND gate 44, NAND gate 49 returns to the high output level, terminating the pulse 49-1. NAND gate 50 then goes low in response to the trailing edge transition of a pulse b1, providing a pulse 50-1. By the leading edge transition of the pulse 50-1, the NAND gates 44 and 43 successively change their binary states to low and high output levels, respectively, and terminates the pulse 50-1. The above process will be repeated so long as the input pulses on terminals A and B occur at alternate intervals, and the output level of the OR gates 51 and 52 is at a constant high DC level.

If the frequency of the signal on terminal B becomes higher then the signal on terminal A and through a pulse b2 appears on terminal B prior to the appearance of a pulse a2 on terminal A, the output of the OR gate 52 is switched to a low level producing a negative going pulse 52-1 because of the simultaneous presence of low level inputs to OR gate 52. It will be understood therefore that if the frequency of the signal on terminal A becomes higher than signal on terminal B, the output of the OR gate 51 will be lowered.

The frequency-phase comparator of FIG. 13 further includes a pair of bistable elements 36 and 39 and a reset gate 50. The bistable element 36 includes a pair of NAND gates 34 and 35 which are so cross-coupled that the output of each is connected to an input of the other, the other input of NAND gate 34 being connected to the output of the OR gate 51 and the other input of NAND gate 35 being connected to the output of the reset NAND gate 40. Likewise, the bistable element 39 includes a pair of cross-coupled NAND gates 37 and 38, one input of the NAND gate 37 being connected to the output of the OR gate 52 and one input of the NAND gate 38 being connected to the output the NAND gate 40. The NAND gate 40 takes its inputs from the outputs of OR gates 51 and 52 and from the outputs of NAND gates 34 and 37. The comparator further includes an OR gate 41 which receives the phase error signal from the output of the NAND gate 46 of bistable element 48 and the output of the NAND gate 34 and delivers the phase error signal to an input of an AND gate 42 when the output of NAND gate 34 is low, the AND gate 42 receiving as its other signal from the output of the NAND gate 38 and the output of the AND gate 42 being connected to the output terminal Z.

Figure 15:
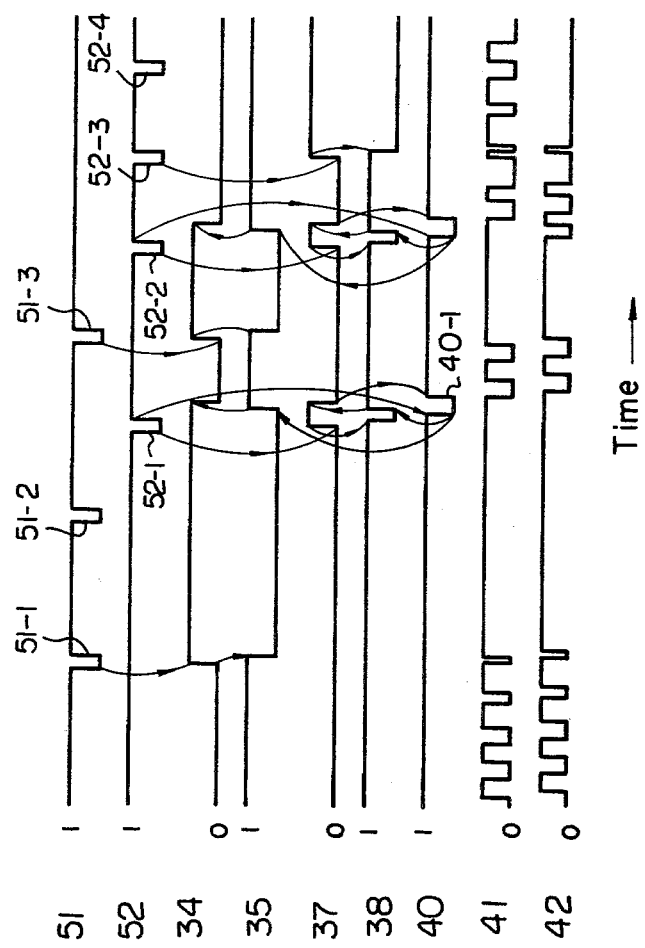

The operation of the frequency-phase comparator of FIG. 13 is fully visualized with reference to FIG. 15. Assume that the frequency of signal on terminal A is initially equal to the signal on terminal B and that NAND gates 34 and 35 are initially low and high DC output levels respectively and NAND gates 37 and 38 are likewise low and high DC output levels respectively. Thus, the phase error signal from the output of NAND gate 46 is applied through OR gate 41 to the AND gate 42 and thence to the output terminal Z. If the signal A becomes higher in frequency than signal B producing pulses 51-1 and 5-2 successively, the NAND gates 34 and then 35 change their output binary states by the leading edge transition of the pulse 51-1, so that the output of the OR gate 41 and hence the output of AND gate 42 is at a constant high DC level. When the frequency of signal A then lowers so that a pulse 52-1 occurs at the output of the OR gate 52, the NAND gates 37 and 38 are successively caused to change their output states by the leading edge transition of the pulse 52-1. In response to the trailing edge transition of the pulse 52-1, all the inputs to the reset NAND gate 40 become low DC level causing it to provide a low level output 40-1, thus resetting the NAND gates 34, 35, 37 and 38, so that OR gate 41 is again allowed to pass the phase error signal to the AND gate 42 and thence to the output terminal Z.

With the signal A becoming higher again in frequency than signal B generating a pulse 51-3, the NAND gates 34 and 35 change their states to inhibit the passage of the phase error signal to the output terminal Z so that the latter is again held at a high DC level. With NAND gates 34 and 35 being at high and low DC output levels respectively, the occurrence of a frequency difference pulse 52-2 will trigger the same circuit actions as occurred in response to the pulse 52-1. Upon a subsequent pulse 52-3, the NAND gates 37 and 38 switch to high and low output levels, respectively, and which conditions continue in the absence of pulses from the output of OR gate 51 regardless of the presence of a subsequent pulse 52-4. As a consequence the output of the AND gates 42 is maintained at a low constant DC level.

Figure 16:
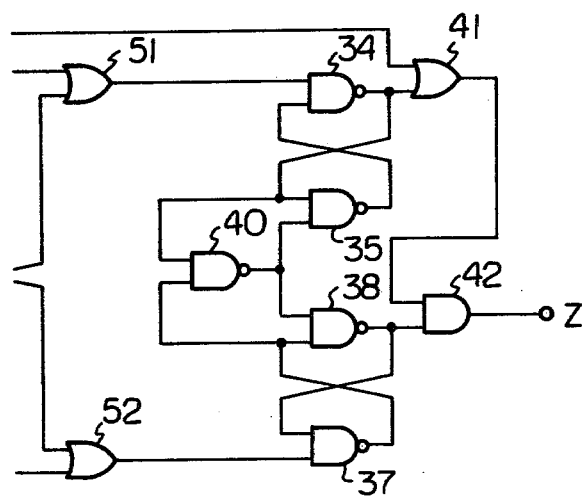
FIGS. 16, 17 and 18 are modifications of the FIG. 11 embodiment.

As illustrated in FIG. 16, the circuit of FIG. 13 can be modified so that the NAND gate 40 takes its inputs only from the outputs of NAND gates 34 and 37. However, the circuit of FIG. 13 is preferred because the logical sequence of its operation is fully ensured against possible occurrence of erratic circuit actions.

Figure 17:
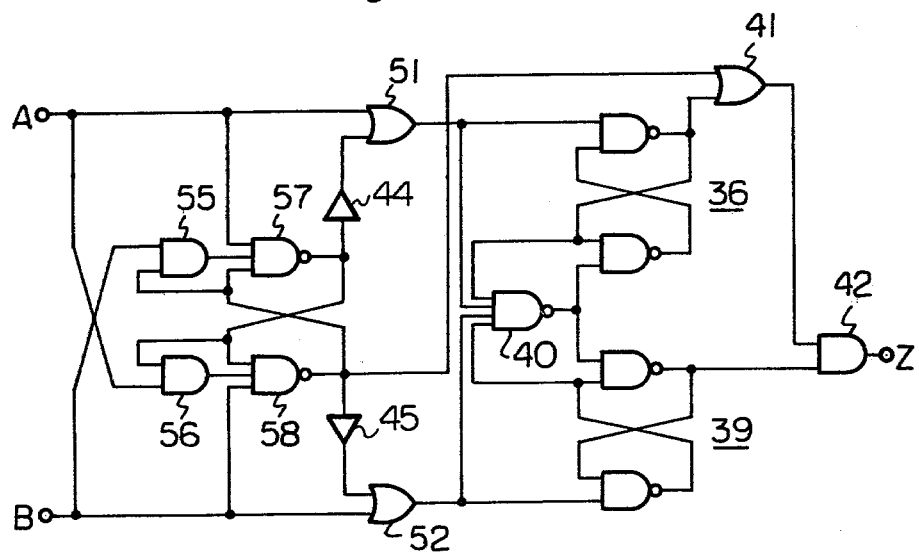

A modification of the phase and frequency detector circuit of FIG. 13 is illustrated in FIG. 17 in which a pair of AND gates 55 and 56 and a pair of NAND gates 57 and 58 are provided. The AND gate 55 takes its inputs from the input terminal B and the output of NAND gate 58 and the AND gate 56 takes its inputs from the input terminal A and the output of NAND gate 57. The NAND gate 57 takes its inputs from the input terminal A, the output from the AND gate 55 and from the output of NAND gate 58 and delivers its output to an input of the OR gate 51 through a buffer amplifier 44, while the NAND gate 58 takes its inputs from the input terminal B, the output of the AND gate 56 and from the output of the NAND gate 57 to deliver its output to an input of the OR gate 52 through a buffer amplifier 45 and also to an input of OR gate 41 as the phase error signal as mentioned above. The buffer amplifiers 44 and 45 serve as delay elements to stretch the output pulse from the OR gates 51 and 52, respectively.

The circuits shown in FIGS. 13, 16 and 17 are constructed to form frequency-phase comparators, and in these circuits it is possible to constitute a frequency comparator from which a triple state frequency difference signal is derived by appropriately combining the output signals of the first and second bistable circuits.

Figure 18:
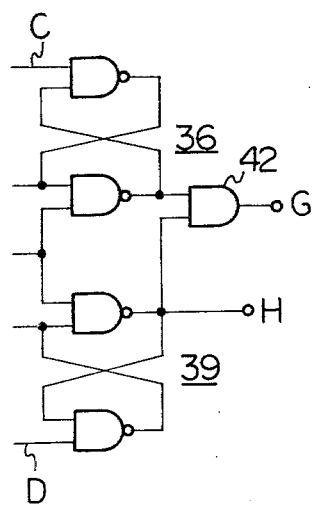

In FIG. 18 wherein a frequency comparator is shown which is similar to the circuit of FIG. 17 with the exception that an input to the AND gate 42 is taken from an output terminal of the bistable circuit 36 and the OR gate 41 is dispensed with, and that two output terminals are provided, one from the output of AND gate 42 and the other from an output terminal of the bistable circuit 39. When the two input pulses are of equal frequencies, the output terminal G is at a high voltage level, and when the frequency of input line A is higher than the frequency of input line B the output terminal G goes low.

Since the prior art frequency-phase comparator of FIG. 1 includes first and second frequency detectors, a frequency comparator of the invention can be constituted by coupling the X and Y output terminals of FIG. 1 to the lines C and D of FIG. 18, respectively, rather than coupling thereto the outputs of frequency detectors of FIG. 18.

Figure 19:
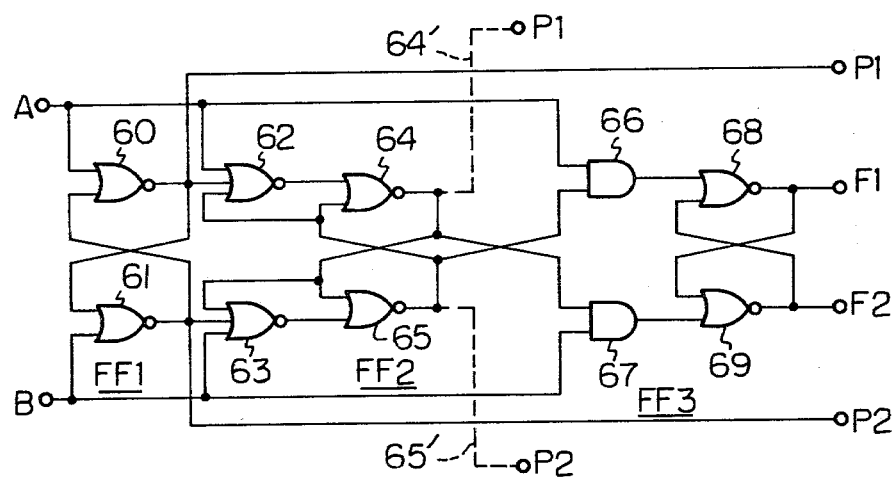
FIG. 19 is a circuit diagram of a second embodiment of the invention.

Referring now to FIG. 19, there is shown a second embodiment of the present invention which comprises a first bistable element or flip-flop FF1 including a pair of cross-coupled NOR gates 60 and 61, a second flip-flop FF2 including a pair of cross-coupled NOR gates 64 and 65 and a third flip-flop FF3 including a pair of cross-coupled NOR gates 68 and 69. The NOR gate 60 has its one input terminal connected to an input terminal A and its other input terminal connected to the output of the NOR gate 61, and the NOR gate 61 has its one input terminal connected to another input terminal B and its other input terminal connected to the output of the NOR gate 60. The output terminals of the NOR gates 60 and 21 are connected to phase signal output terminals P1 and P2, respectively, and also to inputs of NOR gates 62 and 63, respectively. The NOR gate 62 delivers its output signal to an input of the NOR gate 64 of the second flip-flop FF2 whose output is connected on the one hand to an input of the NOR gate 65 and on the other hand to an input of an AND gate 67. Likewise, the NOR gate 23 delivers its output signal to an input of the NOR gate 65 whose output is connected on the one hand to an input of the NOR gate 64 and on the other hand to an input of an AND gate 66. The outputs of the NOR gates 64 and 65 are further connected to an input terminal of NOR gates 62 and 63, respectively. The AND gates 66 and 67 have their other inputs connected to the input terminals A and B, respectively, and deliver their outputs to an input of the NOR gate 68 and 69, respectively, the output terminals of the NOR gates 68 and 69 being connected to frequency signal output terminals F1 and F2, respectively.

Figure 20:
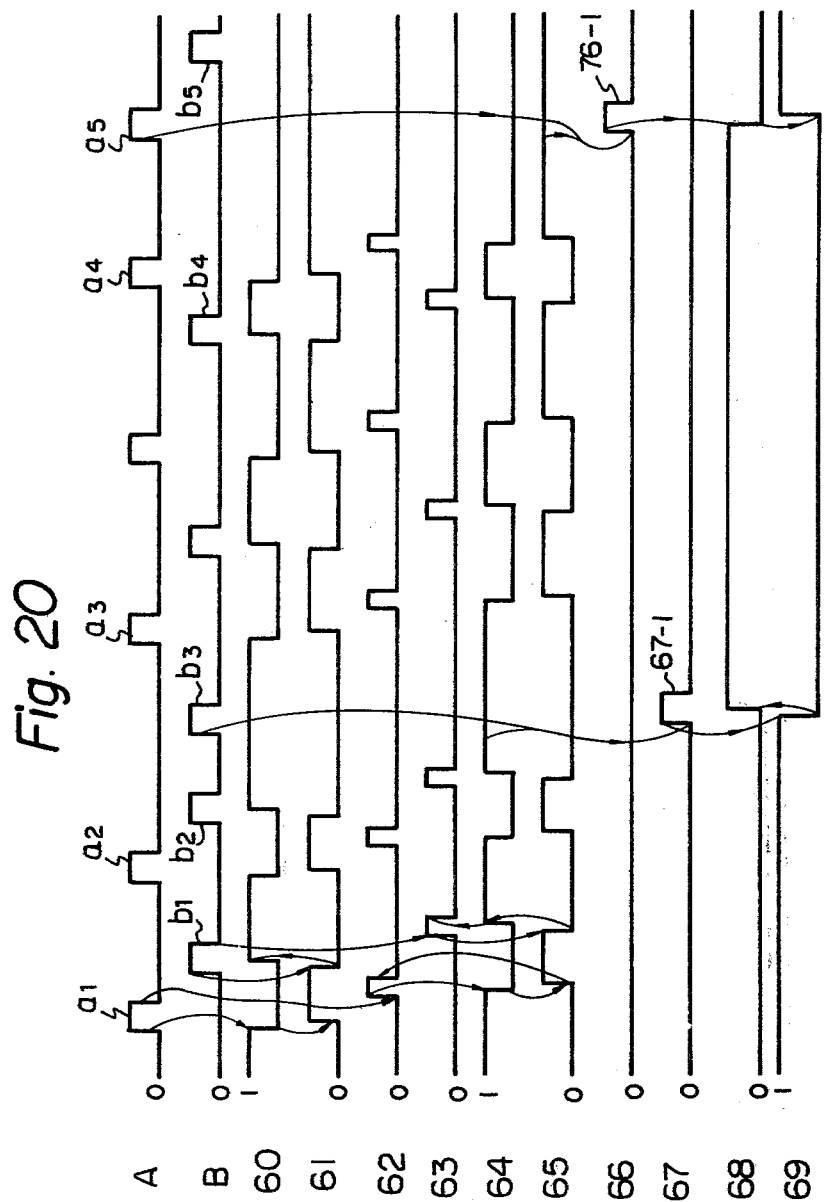
FIG. 20 is a waveform diagram associated with the circuit of FIG. 19.

The operation of the frequency-phase comparator of FIG. 19 can be visuallized with reference to waveforms shown in FIG. 20. Assume that the output states of the NOR gates 60 and 64 are high and those of the NOR gates 61 and 66 are low, application of a pulse a1 to the input terminal A causes the NOR gate 20 to go low by the trailing edge of the pulse a1. The NOR gates 62 and 63 both remain in the low output state due to the high output signal present at their inputs, and AND gates 66 and 67 both remain in the low output state. In response to the trailing edge of the applied pulse a1, all the inputs to the NOR gate 62 go low to cause it to provide a high level output which in turn causes NOR gate 64 to go low and then NOR gate 65, causing the NOR gate 62 to return to the low output state.

Application of a pulse b1 to the terminal B causes the NOR gate 61 to go low in response to the leading edge of the pulse b1, causing the NOR gate 60 to switch to a high level output. In response to the trailing edge of the pulse b1, all the inputs to the NOR gate 63 are low to cause it to switch to a high output state which in turn causes the NOR gate 65 to go low and the NOR gate 64 to go high, so that NOR gate 63 is switched to the low output level. So long as the input pulses on terminals A and B occur alternately, the first flip-flop FF1 is caused to change its binary state and as a result the outputs of the AND gates 66 and 67 are held at a constant low DC level.

If there are two leading edge transitions of pulses b2 and b3 between two leading edge transitions of pulses a2 and a3, the pulse b3 will cause the AND gate 67 to provide a positive pulse 67-1. Similarly, if there are two leading edge transitions of pulses a4 and a5 between two leading edge transitions of pulses b4 and b5, the AND gate 66 will be caused to provide a positive pulse 66-1 by the pulse a5. Therefore, the output of the NOR gate 69 becomes a low DC level in response to the pulse 67-1 causing the NOR gate 68 to become a high output DC level, and these output states of NOR gates 69 and 68 continue until the occurrence of the pulse 66-1.

The signals on output terminals P1 and P2 are thus rectangular pulses with a duty cycle being proportional to the difference in phase between the input frequency signals to terminals A and B, while the signals on output terminals F1 and F2 are a constant DC level signifying the difference in frequency between said input signals.

As seen from FIG. 20, the rectangular pulses derived from the second flip-flop FF2 can also be used as the phase error signal, so that the terminals P1 and P2 can be connected to the output of the NOR gates 64 and 65, respectively, as shown in dotted lines 64', 65' instead of being connected to the outputs of the NOR gates 60 and 61.

Since the first flip-flop FF1 is responsive to the leading edge transition of the input pulses to the terminals A and B, while the second flip-flop FF2 is responsive to the trailing edge transitions of the applied input pulses so as to ensure that AND gates 66 and 67 deliver output pulses only in response to the leading edge of an input pulse, the operation of the frequency-phase comparator of FIG. 19 is logically ensured against a malfunction caused by the lengthening of input pulses. Furthermore, the advantage of the present invention is that phase and frequency error signals can be derived independently from the terminals P1, P2 and F1, F2 as shown in FIG. 19, since, when the frequency-phase comparator of FIG. 19 is used in a phase-locked loop system for purposes of controlling the speed of a motor, these error signals can be directly employed for acceleration or deceleration of the motor, which could otherwise be realized only with the use of a waveform filtering circuit if the prior art comparator of FIG. 1 is employed tending the system to be unsuitable for integrated circuit fabrication.

Figure 21:
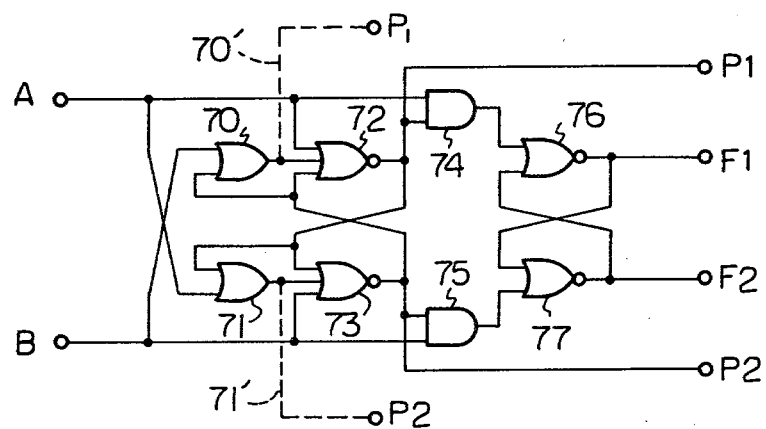
FIG. 21 is a modification of the FIG. 19 circuit.

A modification of the circuit of FIG. 19 is illustrated in FIG. 21 in which NOR gates 72 and 73 are so cross-coupled that the output of each is connected to an input of the other to form a first bistable element. OR gates 70 and 71 have one of their inputs connected to the input terminals B and A, respectively, and the other input connected to the output of NOR gate 73 and 72, respectively. The NOR gate 72 further takes its input from the output of OR gate 70 and from the input terminal A, and the NOR gate 73 further takes its inputs from the output of OR gate 71 and from the input terminal B. An AND gate 74 receives its inputs from the output of NOR gate 72 and from the input terminal A, and an AND gate 74 takes its inputs from the output of NOR gate 73 and from the input terminal B. A second bistable element is provided which comprises a pair of cross-coupled NOR gates 76 and 77 and receives its inputs from the outputs of AND gates 74 and 75 to deliver frequency error signals to output terminals F1 and F2. The first bistable element delivers phase error signals to output terminals P1 and P2.

Referring to FIG. 22, it is assumed that NOR gates 72 and 73 are low and high. The occurrence of a pulse a1 at the input terminal A causes OR gate 71 to go high causing NOR gate 73 to go low, which in turn causes OR gate 70 to go low. These binary states are reversed in response to the leading edge of a pulse b1 on terminal B, and these processes will be repeated so long as the pulses on terminals A and B appear alternately. If pulses b2 and b3 appear between the leading edge transitions of pulses a2 and a3, AND gate 75 is activated in response to the leading edge of the pulse b3 providing a pulse 75-1 which is terminated by the trailing edge transition of NOR gate 73. Responsive to the pulse 75-1 the NOR gate of the second bistable element 77 is switched to a low output level turning the NOR gate 76 to a high output level. The binary state of the second bistable element is reversed to the original state in response to a pulse 74-1 which is generated by the leading edge transition of a pulse a5 subsequent to pulse a4 which occurs prior to a pulse b5. Therefore, the output of the second bistable device is a constant DC level indicating the frequency difference error, while the output of the first bistable device is rectangular pulses indicating the phase error. The phase error signal is also available from the output of the OR gates 70 and 71 as indicated by connections 70' and 71' as is seen from FIG. 22.

Figure 23:
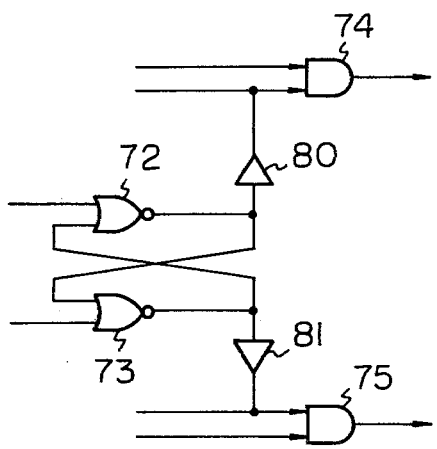
FIG. 23 is a modification of the circuit of FIG. 21.

To ensure the generation of pulses from the AND gates 74 and 75, buffer amplifiers 80 and 81 may be connected to inputs of AND gates 74 and 75, respectively, as a delay element to introduce a delay to the outputs of NOR gates 72 and 73, respectively, as shown in FIG. 23.

Figure 6:
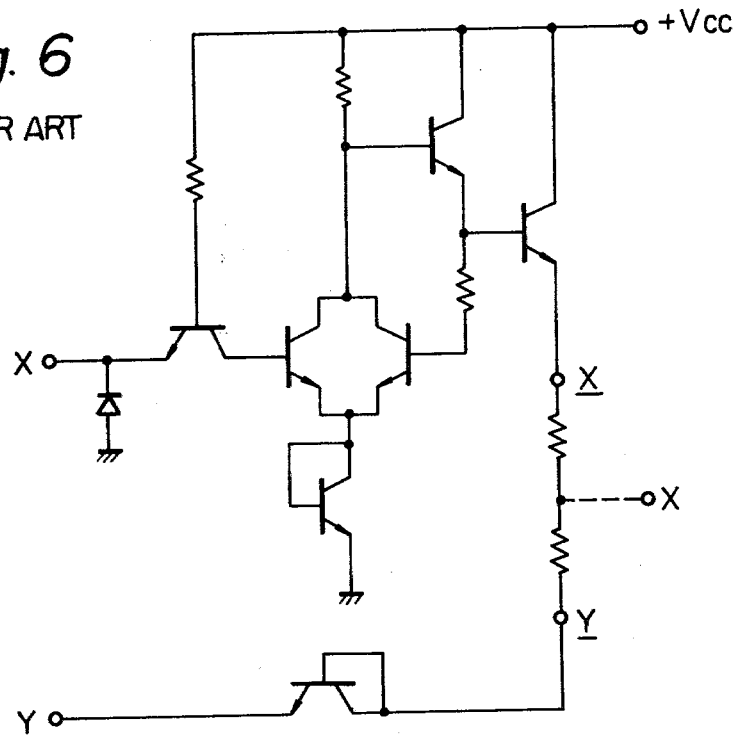
FIG. 6 is a circuit diagram of a prior art charge pump circuit.
Figure 7:
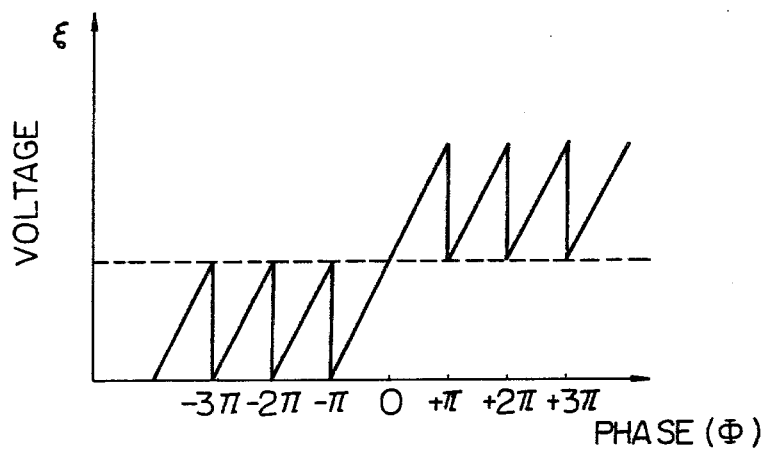
FIG. 7 is a graphic illustration of an operating characteristic of the FIG. 1 circuit combined with the charge pump circuit of FIG. 6.

A circuit shown in FIG. 24 may be connected to the phase difference output terminals P1 and P2 and the frequency difference output terminals F1 and F2. The signals from terminals P1 and F1 are coupled to input terminals of an OR gate 82 and the signals from terminals P2 and F2 are connected to input terminals of an OR gate 83 to respectively couple their output signals to terminals X and Y from which signals similar to those appearing at the terminals X and Y of FIG. 1 are delivered. Another combining network is shown in FIG. 25 which includes resistors 84 and 85 having one end of each being connected to the output terminal Z and the other ends connected respectively to the phase comparator terminal P1 and frequency comparator terminal F1 of FIG. 19 or 21. The combined waveform at the terminal Z has output characteristics identical to those obtained from the output of the charge pump circuit of FIG. 6 when connected to the frequency-phase comparator of FIG. 1.

Figure 26:
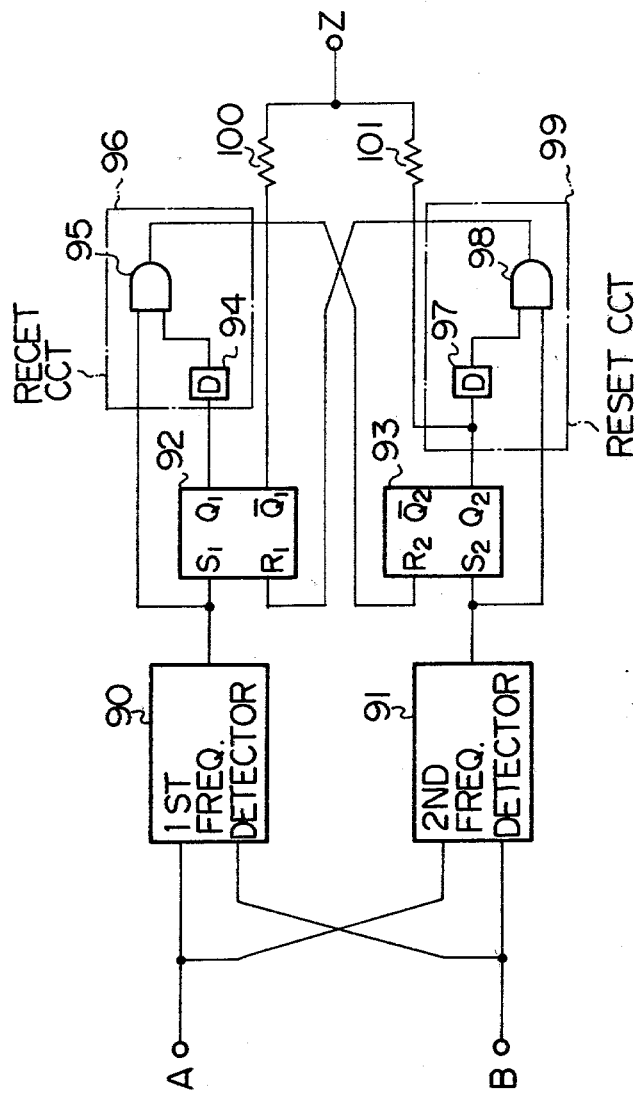
FIG. 26 is a schematic block diagram of a further modification of the embodiment of FIG. 11.

FIG. 26 shows a further modification of the embodiment of FIG. 11 shown as comprised of a frequency comparator (which can easily be modified to function as a frequency-phase comparator). The comparator of FIG. 26 includes a first frequency detector 90 which generates an output signal in response to there being two or more leading edge transitions of input pulses supplied to the input line B during the interval between the leading edge transitions of the input pulses successively supplied to the input line A, and a second frequency detector 91 which generates an output signal in response to there being two or more leading edge transitions of input pulses supplied to the input line A during the interval between the leading edge transitions of the input pulses successively supplied to the input line B. A first bistable circuit 92 is connected to the output of detector 90 to be set in response to an output signal therefrom. To the output of the detector 91 is connected a second bistable circuit 93 which is set in response to an output signal from the detector 91. To the output of the first bistable circuit 92 is coupled a delay circuit 94 which supplies a delayed signal to an input of an AND gate 95 which constitutes with the delay circuit 94 a first resetting circuit 96. This resetting circuit functions to reset the second bistable circuit 93 in response to an output signal from the first frequency detector 90 being generated again after the first bistable circuit 92 is switched to the set condition. A second resetting circuit 99 of a similar construction to the resetting circuit 96 is included which comprises a delay circuit 97 connected to the output of the second bistable circuit 93 to apply its output to an inut of an AND gate 98. The second resetting circuit 99 functions to reset the first bistable circuit 92 in response to an output signal from the second frequency detector 91 which is generated again after the second bistable circuit 93 is switched to the set condition.

The complementary and true output terminals $Q_1$ and $Q_2$ of the first and second bistable circuits 92 and 93, respectively, are connected together through respective coupling resistors 100 and 101 to the output terminal Z at which there appears an analog voltage signal of the combined outputs of the bistable circuits 92 and 93.

Figure 27:
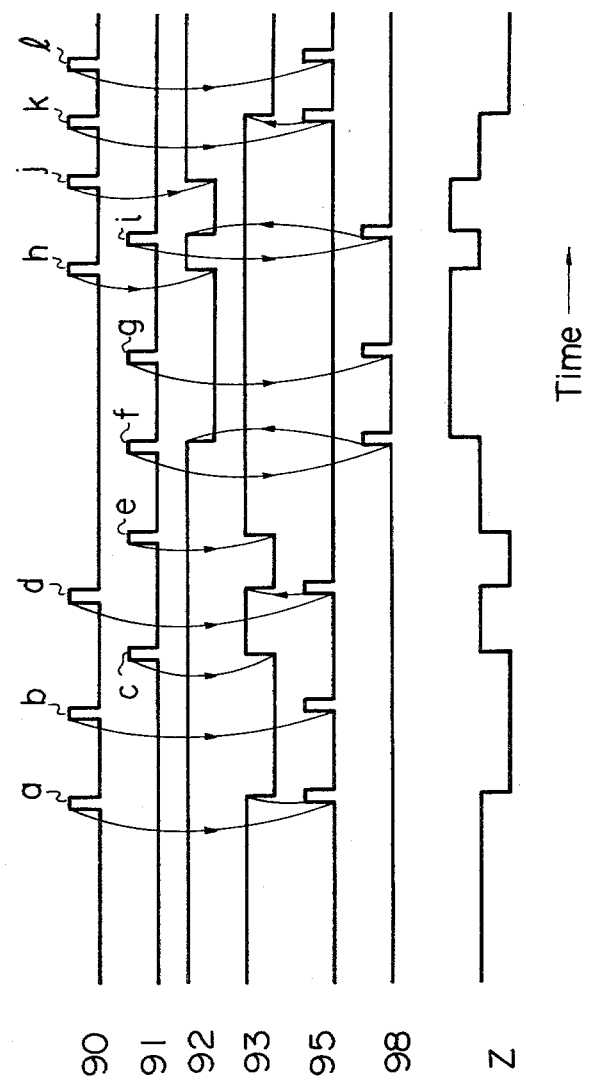
FIG. 27 is a waveform diagram associated with the FIG. 26 embodiment.

The operation of the circuit of FIG. 26 may be more fully understood with reference to waveforms shown in FIG. 27. Assume that the output states of the first and second bistable circuits 92, 93 are both at high voltage level. An output pulse a from the first frequency detector 90 will cause the AND gate 95 to switch to a high voltage level in response to the leading edge transition of the pulse a and the second bistable circuit 93 is reset to cause its $Q_2$ output to go low. The AND 95 will be again caused to generate a reset pulse for the second bistable circuit 93 in response to the next pulse b, but the low output state of the bistable circuit 93 remains unchanged. A pulse c from the second frequency detector 91 will cause the second bistable circuit 93 to switch to a set condition providing a high voltage signal at its $Q_2$ output terminal. Because of the delay interval introduced by the delay circuit 97, the input conditions of the AND gate 98 are not satisified, so that it continues to deliver a low voltage output. The second bistable circuit 93 will be reset again in response to a pulse d from the first frequency detector 90 and set in response to a pulse e from the second frequency detector 91. A pulse f, which is delivered from the second frequency detector 91 in succession to the previous pulse e before the first frequency detector 90 delivers an output pulse, will cause to AND gate 98 to go high and reset the first bistable 92. The next pulse g from the second frequency detector 91 will only cause the AND gate 98 to generate a reset pulse without causing the bistable 92 to change its binary state.

A pulse h from the first frequency detector 90 will set the first bistable 92 and a pulse i from the second frequency detector 91 will reset it again. The first and second bistable circuits 92 and 93 will be sucessively caused to change their binary states in response to pulses j and k delivered successively from the first detector 90. The output states of the first and second bistable circuits remain unchanged in the presence of a next pulse l delivered from the first detector 90 in succession to the previous pulses j and k.

Therefore, the combined waveform of the complementary output of bistable 92 and the true output of bistable 93 which appears at the terminal Z is an analog voltage which assumes one of three DC levels depending on the frequency difference between the input pulses applied to terminals A and B. More specifically, when the frequency of pulses on terminal A is higher than the pulses on terminal B, the combined output level is a low DC level, and when the two frequencies are equal the combined output takes on a medium DC level. When the frequency of pulses on terminal A is lower than the pulses on terminal B, the combined output is a high DC level.

A phase detector (not shown) may be connected to be combined with output signals from the first and second bistable circuits 92 and 93 to constitute a frequency-phase comparator.

Figure 28:
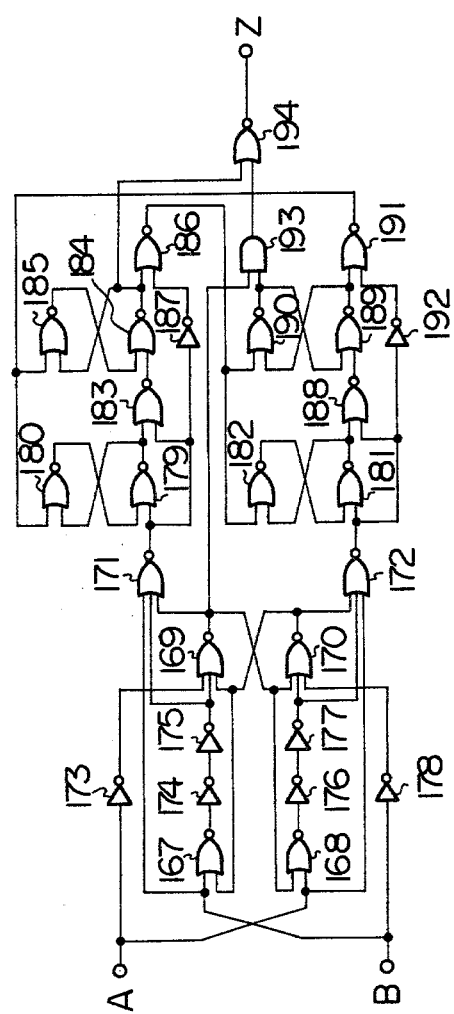
FIG. 28 is a circuit diagram of a frequency-phase comparator based on the block diagram of FIG. 26.

An embodiment shown in FIG. 28 is a frequency-phase comparator which is based on the block diagram of FIG. 26 and constructed essentially of a plurality of NOR gates. NOR gates 167 to 172 and inverters 173 to 178 constitute a phase detector and the first and second frequency detectors of the FIG. 21 embodiment. The output signal from the first frequency detector is derived from the output of the NOR gate 171 and the output signal from the second frequency detector is available from the output of the NOR gate 172, while the output signal from the phase detector is available from the output of the NOR gate 169. NOR gates 179 and 180 constitute the first bistable circuit 92 of FIG. 21 and NOR gates 181 and 182 constitute the second bistable circuit 93 of FIG. 21. The first reset circuit 96 is formed by NOR gates 183 to 186 and an inverter 187 and the second reset circuit 99 is formed by NOR gates 188 to 191 and an inverter 192. NOR gates 193 and 194 constitute the combining network including resistors 100 and 101.

Although the embodiments described above are shown as comprising a plurality of AND, OR, and NAND gates, the invention is not restricted to the use of these logical gates, but the circuit should be so constructed that it best meets the requirements of a large-scale integration or the requirements of a system in which the present invention is employed.

Figure 29:
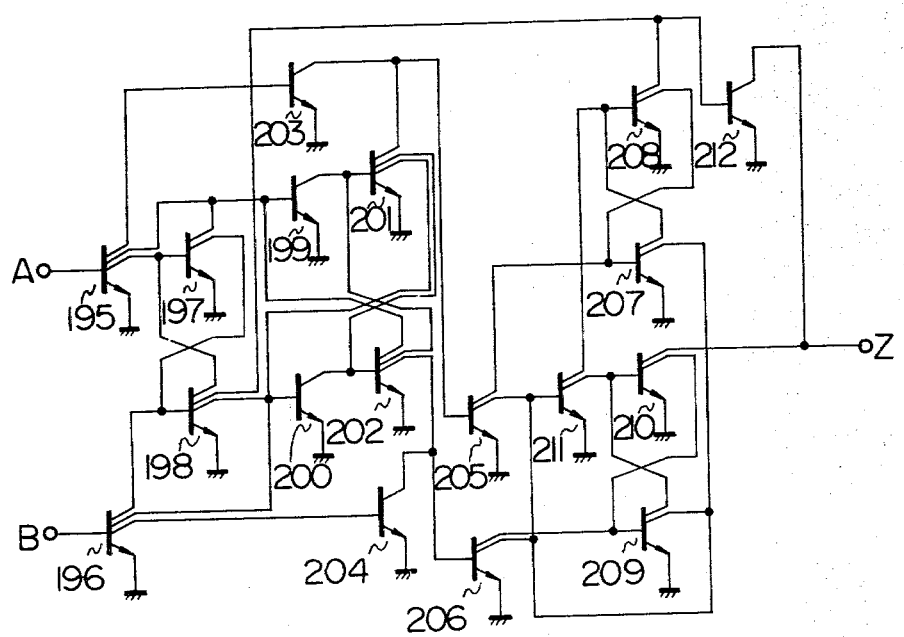
FIGS. 29 to 31 are circuit diagrams of the frequency-phase comparator of the invention using a plurality of IIL elements.
Figure 30:
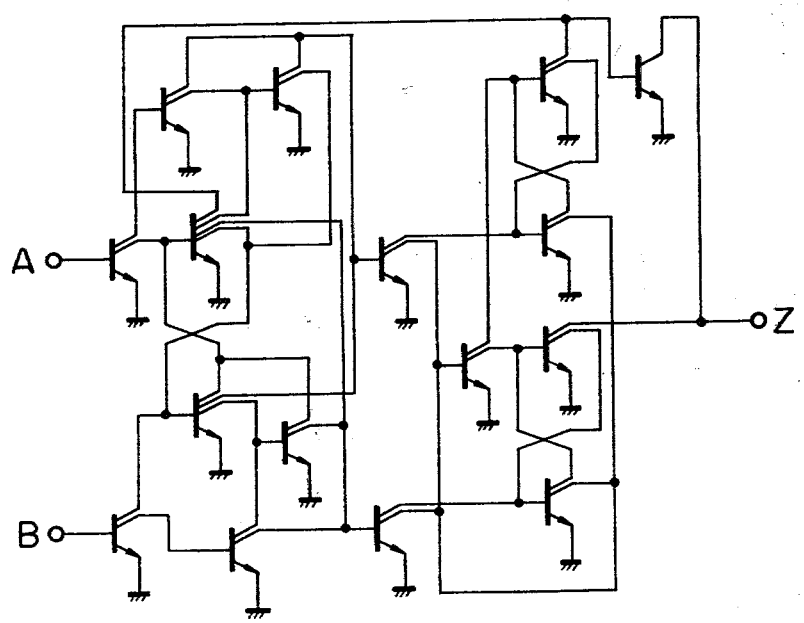
Figure 31:
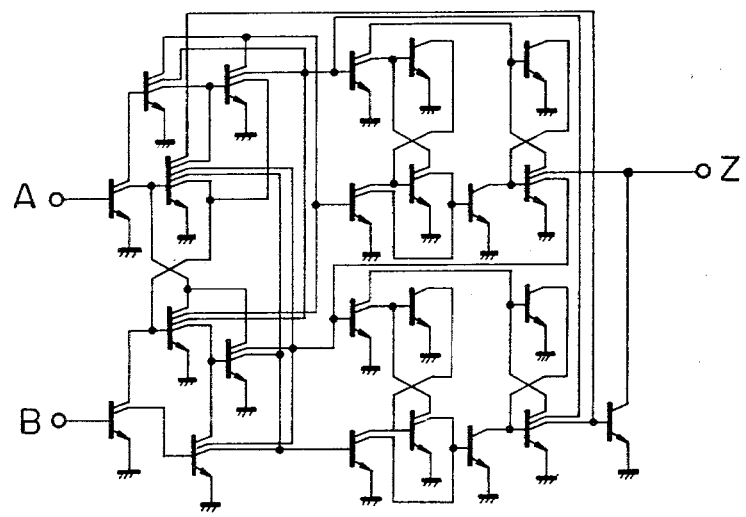

The circuits shown in FIGS. 29, 30 and 31 employ a plurality of IIL elements (or multiple output inverter logic) to constitute the frequency-phase comparator of the invention in which the source of current is omitted for the sake of clarity. In FIG. 29, first to tenth IIL elements 195 to 204 constitute the phase detector and first and second frequency detectors of FIG. 19, and eleventh to eighteenth IIL elements constitute the frequency discriminating means and combining means of FIG. 13.

Likewise, in FIG. 30, the first eight-stage of IIL elements constitutes the phase detector and first and second frequency detectors of FIG. 21, and the latter eight-stage of IIL elements constitutes the frequency discriminating and combining means of FIG. 13.

In FIG. 31, the first eight-stage of IIL elements constitutes the phase detector of FIG. 21 and the latter eight-stage of IIL elements constitutes the frequency discriminating and combining means of FIG. 28.

In the previous embodiments shown in FIGS. 11, 13, 16, 19, 21, 28 to 31, the input pulses are required to have a pulse width much narrower than the interval between successive pulses. If the pulse width of the input signal becomes excessively large, the frequency-phase comparators shown in these Figures may produce an error in the phase difference output although the comparator does not completely fail to achieve its defined functions (For example, if the pulse width occupies 10 percent of the period between successive pulses, the phase difference error will also become 10 percent.).

Therefore, it is not desirable to impress input pulses of 50 percent duty cycle to the frequency-phase comparator of the invention. However, this limitation on the pulse width is of no practical problem, since the frequency-phase comparator of the invention is substantially free from errors even if the input pulse width becomes greater than the delay time of two cascaded gates, while the prior art frequency-phase comparator of FIG. 9 fails to operate under such input conditions. Furthermore, in cases where there is no severe limitations on the pulse width requirement, the input pulse of a considerable width can be differentiated prior to application to the frequency-phase comparator of the invention.

Figure 32:
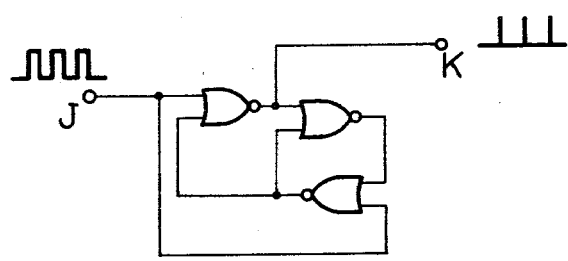
FIGS. 32 and 33 are examples of differentiator circuit.
Figure 33:
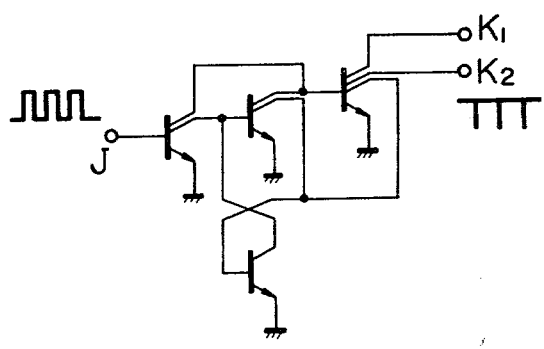

For example, the circuit of FIG. 32 is an illustrative of a differentiator which can be employed in the present invention and which delivers to an output terminal K output pulses of a duration equal to the delay time of three cascaded gates for all input pulses of any duration applied to an input terminal J, and the circuit of FIG. 33 is also a differentiator comprised of four IIL elements in which the injectors to serve as a current source are omitted for clarity.

Figure 34:
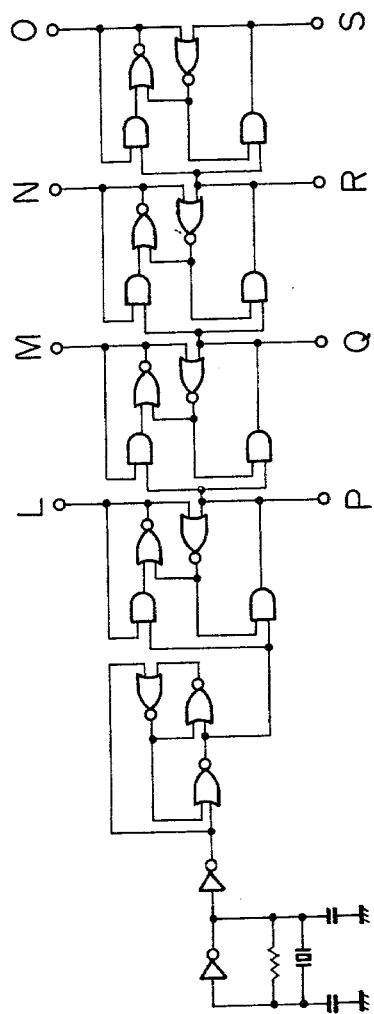
FIG. 34 is a circuit diagram of a frequency divider which generates differentiated output signals.

Additionally, in applications such as phase-locked loop frequency synthesizers wherein the output signal from a crystal oscillator is applied to a frequency divider to provide a first output and the output signal from a voltage-controlled oscillator is applied to a programmable frequency divider to provide a second output and the first and second outputs are both applied to input terminals of a phase comparator, it is easy to derive the output signal from the programmable frequency divider in the form of differentiated signal (the reset or preset signals to the aforesaid programmable frequency divider also becomes differentiated waveform). In such application, a frequency divider shown in FIG. 34 can be used in which the output terminals P, Q, R and S deliver signals of a differentiated waveform (while the output terminals L, M, N and O deliver signals of a rectangular waveform), so that the maximum pulse width limitation poses no substantial problem.

In summary, according to the first aspect or embodiment of the invention, there is provided a frequency comparator or a frequency-phase comparator which comprises first and second bistable circuits which are arranged to be set in response to an output signal from a frequency detecting means. This combination permits a simplified circuitry to be employed to effect generation of an ideal triple state output which takes on one of three different DC levels depending on the relative frequencies of pulses supplied to two input terminals. According to the second aspect of the invention, there is provided a frequency comparator or a frequency-phase comparator which comprises a first bistable circuit which repeatedly changes its binary state in response to the leading edge transition of the input pulses supplied alternately to first and second input lines, a delay means which completes the resetting operation of the first bistable circuit after the trailing edge transition of the input pulse, a frequency detector which detects the presence of an ineffective input pulse supplied to either one of the first and second input lines without casing the first bistable circuit to change its binary state (this frequency detector comprises said first bistable circuit and a pair of first and second coincidence gates having input terminals connected respectively to the first and second input lines and to an output terminal of the first bistable circuit) and a second bistable circuit responsive to an output signal from the frequency detector. Because of this combination, the output signal from the comparator of the invention is an accurate representation of the difference in frequency between the two input pulse signals. This combination allows a simplified circuit design to derive phase difference and frequency difference output signals separately from each other.

What is claimed is:

1. A frequency comparator having first and second input lines to which input pulses are supplied, comprising:
   a first frequency detector for generating an output signal in response to there being two or more leading edge transitions of the input pulses supplied to said first input line during the interval between two leading edge transitions of the input pulses supplied to said second input line;
   a second frequency detector for generating an output signal in response to there being two or more leading edge transitions of the input pulses supplied to said second input line during the interval between two leading edge transitions of the input pulses supplied to said first input line;
   a first bistable element arranged to be set in response to the output signal of said first frequency detector;
   a second bistable element arranged to be set in response to the output signal of said second frequency detector;
   means for resetting said first and second bistable elements in response to both of said first and second bistable elements becoming a set condition; and
   means connected to output terminals of said first and second bistable elements for generating an output signal representative of the difference in frequency between the input pulses supplied to said first and second input lines.

2. A frequency comparator as claimed in claim 1, wherein said first frequency detector comprises a third bistable element arranged to repeatedly change its binary output state in response to the input pulses supplied to said first and second input lines when said input pulses at said first input line are supplied alternately with the input pulses supplied to said second input line; delay means for completing the resetting operation of said third bistable element after the trailing edge transition of an effective input pulse supplied to said first or second input line, said effective pulse causing said third bistable element to change its binary output state; and a first coincidence gate having a first input terminal connected to said first input line and a second input terminal connected to an output terminal of said third bistable element for generating an output signal in response to the leading edge transition of an ineffective input pulse supplied to said first input line, said ineffective input pulse causing the binary output state of said third bistable element to remain unchanged, and wherein said second frequency detector comprises said third bistable element, said delay means and a second coincidence gate having a first input terminal connected to said second input line and a second input terminal connected to an output terminal of said third bistable element for generating an output signal in response to the leading edge transition of an ineffective input pulse supplied to said second input line, the last-mentioned ineffective pulse causing the binary output state of said third bistable element to remain unchanged.

3. A frequency comparator as claimed in claim 2, wherein said delay means comprises a fourth bistable element having a set input terminal connected to said first input line and a reset input terminal connected to said second input line to repeatedly change its binary output state in response to the leading edge transition of said effective pulse supplied to said first and second input lines; a third coincidence gate having input terminals connected respectively to said first input line and an output terminal of said fourth bistable element for setting said third bistable element in response to the trailing edge transition of said effective pulse supplied to said first input line; and a fourth coincidence gate having input terminals connected respectively to said second input line and to an output terminal of said fourth bistable element for resetting said third bistable element in response to the trailing edge transition of said effective pulse supplied to said second input line.

4. A frequency comparator as claimed in claim 2, wherein said delay means comprises a pair of third and fourth coincidence gates which are so cross-coupled that the output terminal of each is connected to a first input terminal of the other, said third coincidence gate having a second input terminal connected to said first input line and said fourth coincidence gate having a second input terminal connected to said second input line; a fifth coincidence gate having input terminals connected respectively to said second input line and to an output terminal of said third bistable element and an output terminal connected to a third input terminal of said third coincidence gate; and a sixth coincidence gate having input terminals connected respectively to said first input line and to an output terminal of said third bistable element and an output terminal connected to a third input terminal of said fourth coincidence gate.

5. A frequency comparator as claimed in claim 1 or 2, wherein said resetting means comprises a resetting gate having input terminals connected respectively to the output terminals of said first and second frequency detectors and to the output terminals of said first and second bistable elements for resetting said first and second bistable elements in response to the trialing edge transition of an output pulse from one of said first and second frequency detectors, said output pulse causing said first and second bistable elements to change to a set condition.

6. A frequency-phase comparator having first and second input lines to which input pulses are supplied, comprising:
   a phase detector for generating rectangular output pulses as a function of the difference in phase between the input pulses supplied to said first and second input lines;
   a first frequency detector for generating an output signal in response to there being two or more leading edge transitions of input pulses supplied to said first input line during the interval between the leading edge transitions of successive input pulses supplied to said second input line;
   a second frequency detector for generating an output signal in response to there being two or more leading edge transitions of input pulses supplied to said second input line during the interval between the leading edge transitions of successive input pulses supplied to said first input line;
   a first bistable element arranged to be switched to a set condition in response to the output signal of said first frequency detector;
   a second bistable element arranged to be switched to a set condition in response to the output signal of said second frequency detector;
   means for resetting said first and second bistable elements when said first and second bistable elements are both switched to said set condition; and
   means for combining the output pulses of said phase detector with output signals from said first and second bistable elements to generate a first DC level output when the frequency of input pulses supplied to said first input line is lower than the frequency of input pulses supplied to said second input line, or a rectangular pulse output representative of the phase difference between said input pulses supplied to said first and second input lines, or a second DC level output when the frequency of input pulses supplied to said first input line is higher than the frequency of input pulses supplied to said second input line.

7. A frequency-phase comparator as claimed in claim 6, wherein said first frequency detector comprises a third bistable element arranged to repeatedly change its binary output state in response to the input pulses supplied to said first and second input lines when said input pulses to said first input line are supplied alternately with the input pulses supplied to said second input line; delay means for completing the resetting operation of said third bistable element after the trailing edge transition of a effective input pulse supplied to said first or second input line, said effective pulse causing said third bistable element to change its binary output state; and a first coincidence gate having a first input terminal connected to said first input line and a second input terminal connected to an output terminal of said third bistable element for generating an output signal in response to the leading edge transition of an ineffective input pulse supplied to said first input line, said ineffective input pulse causing the binary output state of said third bistable element to remain unchanged, and wherein said second frequency detector comprises said third bistable element, said delay means and a second coincidence gate having a first input terminal connected to said second input line and a second input terminal connected to an output terminal of said third bistable element for generating an output signal in response to the leading edge transition of an ineffective input pulse supplied to said second input line, the last-mentioned ineffective pulse causing the binary output state of said third bistable element to remain unchanged.

8. A frequency-phase comparator as claimed in claim 7, wherein said delay means comprises a fourth bistable element having a set input terminal connected to said first input line and a reset input terminal connected to said second input line to repeatedly change its binary output state in response to the leading edge transition of said effective pulse received at said first and second input lines; a third coincidence gate having a first input terminal connected to said first input line and a second input terminal connected to an output terminal of said fourth bistable element for setting said third bistable element in response to the trailing edge transition of said effective pulse supplied to said first input line; and a fourth coincidence gate having a first input terminal connected to said second input line and a second input terminal connected to an output terminal of said fourth bistable element for resetting said third bistable element in response to the trailing edge transition of said effective pulse supplied to said second input line.

9. A frequency-phase comparator as claimed in claim 7, wherein said delay means comprises a pair of third and fourth coincidence gates which are so cross-coupled that the output terminal of each is connected to a first input terminal of the other, said third coincidence gate having a second input terminal connected to said first input line and said fourth coincidence gate having a second input terminal connected to said second input line; a fifth coincidence gate having a first input terminal connected to said second input line, a second input terminal connected to an output terminal of said third bistable element, and an output terminal connected to a third input terminal of said third coincidence gate; and a sixth coincidence gate having a first input terminal connected to said first input line, a second input terminal connected to an output terminal of said third bistable element, and an output terminal connected to a third input terminal of said fourth coincidence gate.

10. A frequency-phase comparator as claimed in claim 7, wherein said phase detector comprises said third bistable element.

11. A frequency-phase comparator as claimed in claim 7, wherein said said phase detector comprises said fourth bistable element.

12. A frequency-phase comparator as claimed in claim 7, wherein said phase detector comprises said fifth coincidence gate.

13. A frequency-phase comparator as claimed in claim 7, wherein said phase detector comprises said sixth coincidence gate.

14. A frequency-phase comparator as claimed in claim 6 or 7, wherein said resetting means comprises a resetting gate having input terminals connected respectively to the output terminals of said first and second frequency detectors and to the output terminals of said first and second bistable elements for generating a reset pulse for resetting said first and second bistable elements in response to the trailing edge transition of an output pulse from one of said first and second frequency detectors, said output pulse causing said first and second bistable elements to switch to a set condition.

15. A frequency-phase comparator as claimed in claim 6 or 7, wherein said combining means comprises a logical OR gate having a first input terminal connected to receive an output signal from said phase detector and a second input terminal connected to receive an output signal from said second bistable element; and a logical AND gate having a first input terminal connected to receive an output signal from one of said first and second bistable elements and a second input terminal connected to receive an output signal from said logical OR gate.

16. A frequency comparator having first and second input lines to which input pulses are supplied, comprising:
- a first frequency detector for generating an output signal in response to there being two or more leading edge transitions of the input pulses supplied to said first input line during the interval between two leading edge transitions of the input pulses supplied to said second input line;
- a second frequency detector for generating an output signal in response to there being two or more leading edge transitions of the input pulses supplied to said second input line during the interval between two leading edge transitions of the input pulses supplied to said first input line;
- a first bistable element arranged to be set in response to the output signal of said first frequency detector;
- a second bistable element arranged to be set in response to the output signal of said second frequency detector;
- first means for resetting said second bistable element in response to the output signal of said first frequency detector which occurs again after said first bistable element is switched to the set condition;
- second means for resetting said first bistable element in response to the output signal of said second frequency detector which occurs again after said second bistable element is switched to the set condition; and
- means connected to output terminals of said first and second bistable elements for generating an output signal representative of the difference in frequency between said input pulses supplied to said first and second input lines.

17. A frequency-phase comparator as claimed in claim 16, wherein said first frequency detector comprises a third bistable element arranged to repeatedly change its binary output state in response to the input pulses supplied to said first and second input lines when said input pulses to said first input line are supplied alternatively with the input pulses supplied to said second input line; delay means for completing the resetting operation of said third bistable element after the trailing edge transition of an effective input pulse supplied to said first or second input line, said effective pulse causing said third bistable element to change its binary output state; and a first coincidence gate having a first input terminal connected to said first input line and a second input terminal connected to an output terminal of said third bistable element for generating an output signal in response to the leading edge transition of an ineffective input pulse supplied to said first input line, said ineffective input pulse causing the binary output state of said third bistable element to remain unchanged, and wherein said second frequency detector comprises said third bistable element, said delay means and a second coincidence gate having a first input terminal connected to said second input line and a second input terminal connected to an output terminal of said third bistable element for generating an output signal in response to the leading edge transition of an ineffective input pulse supplied to said second input line, the last-mentioned ineffective pulse causing the binary output state of said third bistable element to remain unchanged.

18. A frequency-phase comparator as claimed in claim 17, wherein said delay means comprises a fourth bistable element having a set input terminal connected to said first input line and a reset input terminal connected to said second input line to repeatedly change its binary output state in response to the leading edge transition of said effective pulse supplied to said first and second input lines; a third coincidence gate having a first input terminal connected to said first input line and a second input terminal connected to an output terminal of said fourth bistable element for setting said third bistable element in response to the trailing edge transition of said effective pulse supplied to said first input line; and a fourth coincidence gate having a first input terminal connected to said second input line and a second input terminal connected to an output terminal of said fourth bistable element for resetting said third bistable element in response to the trailing edge transition of said effective pulse supplied to said second input line.

19. A frequency comparator as claimed in claim 17, wherein said delay means comprises a pair of third and fourth coincidence gates which are so cross-coupled that the output terminal of each is connected to a first input terminal of the other, said third coincidence gate having a second input terminal connected to said first input line and said fourth coincidence gate having a second input terminal connected to said second input line; a fifth coincidence gate having a first input terminal connected to said second input line, a second input terminal connected to an output terminal of said third bistable element, and an output terminal connected to a third input terminal of said third coincidence gate; and a sixth coincidence gate having a first input terminal connected to said first input line, a second input terminal connected to an output terminal of said third bistable element, and an output terminal connected to a third input terminal of said fourth coincidence gate.

20. A frequency-phase comparator having first and second input lines to which input pulses are supplied, comprising:
- a phase detector for generating rectangular output pulses as a function of the difference in phase between the input pulses supplied to said first and second input lines;
- a first frequency detector for generating an output signal in response to there being two or more leading edge transitions of input pulses supplied to said first input line during the interval between the leading edge transitions of successive input pulses supplied to said second input line;
- a second frequency detector for generating an output signal in response to there being two or more leading edge transitions of input pulses supplied to aid second input line during the interval between the leading edge transitions of successive input pulses supplied to said first input line;
- a first bistable element arranged to be switched to a set condition in response to the output signal of said first frequency detector;
- a second bistable element arranged to be switched to a set condition in response to the output signal of said second frequency detector;
- first means for resetting said second bistable element in response to the output signal of said first frequency detector which occurs again after said first bistable element is switched to the set condition;

second means for resetting said first bistable element in response to the output signal of said second frequency detector which occurs again after said second bistable element is switched to the set condition; and means for combining the output pulses of said phase detector with output signals from said first and second bistable elements to generate a first DC level output when the frequency of input pulses supplied to said first input line is lower than the frequency of input pulses supplied to said second input line, or a rectangular pulse output representative of the phase difference between said input pulses supplied to said first and second input lines, or a second DC level output when the frequency of input pulses supplied to said first input line is higher than the frequency of input pulses supplied to said second input line.

21. A frequency-phase comparator as claimed in claim 20, wherein said first frequency detector comprises a third bistable element arranged to repeatedly change its binary output state in response to the input pulses supplied to said first and second input lines when said input pulses at said first input line are supplied alternately with the input pulses supplied to said second input line; delay means for completing the resetting operation of said third bistable element after the trailing edge transition of an effective input pulse supplied to said first or second input line, said effective pulse causing said third bistable element to change its binary output state; and causing said third bistable element to change its binary output state; and a first coincidence gate having a first input terminal connected to said first input line and a second input terminal connected to an output terminal of said third bistable element for generating an output signal in response to the leading edge transition of an ineffective input pulse supplied to said first input line, said ineffective input pulse causing the binary output state of said third bistable element to remain unchanged, and wherein said second frequency detector comprises said third bistable element, said delay means and a second coincidence gate having a first input terminal connected to said second input line and a second input terminal connected to an output terminal of said third bistable element for generating an output signal in response to the leading edge transition of an ineffective input pulse supplied to said second input line, the last-mentioned ineffective pulse causing the binary output state of said third bistable element to remain unchanged.

22. A frequency-phase comparator as claimed in claim 21, wherein said delay means comprises a fourth bistable element having a set input terminal connected to said first input line and a reset input terminal connected to said second input line to repeatedly change its binary output state in response to the leading edge transition of said effective pulse supplied to said first and second input lines; a third coincidence gate having a first input terminal connected to said first input line and a second input terminal connected to an output terminal of said fourth bistable element for setting said third bistable element in response to the trailing edge transition of said effective pulse supplied to said first input line; and a fourth coincidence gate having a first input terminal connected to said second input line and a second input terminal connected to an output terminal of said fourth bistable element for resetting said third bistable element in response to the trailing edge transition of said effective pulse supplied to said second input line.

23. A frequency-phase comparator as claimed in claim 21, wherein said delay means comprises a pair of third and fourth coincidence gates which are so cross-coupled that the output terminal of each is connected to a first input terminal of the other, said third coincidence gate having a second input terminal connected to said first input line and said fourth coincidence gate having a second input terminal connected to said second input line; a fifth coincidence gate having a first input terminal connected to said second input line, a second input terminal connected to an output terminal of said third bistable element, and an output terminal connected to a third input terminal of said third coincidence gate; and a sixth coincidence gate having a first input terminal connected to said first input line, a second input terminal connected to an output terminal of said third bistable element, and an output terminal connected to a third input terminal of said fourth coincidence gate.

24. A frequency-phase comparator as claimed in claim 21, wherein said phase detector comprises said third bistable element.

25. A frequency-phase comparator as claimed in claim 21, wherein said said phase detector comprises said fourth bistable element.

26. A frequency-phase comparator as claimed in claim 21, wherein said phase detector comprises said fifth coincidence gate.

27. A frequency-phase comparator as claimed in claim 21, wherein said phase detector comprises said sixth coincidence gate.

28. A frequency-phase comparator as claimed in claim 6 or 7, wherein said combining means comprises a logical OR gate having a first input terminal connected to receive an output signal from said phase detector and a second input terminal connected to receive an output signal from said second bistable element; and a logical AND gate having a first input terminal connected to receive an output signal from one of said first and second bistable elements and a second input terminal connected to receive an output signal from said logical OR gate.

29. A frequency comparator having first and second input lines to which input pulses are supplied, comprising:
a first bistable element having first and second input terminals connected respectively to said first and second input lines to change its binary output state in response to a pulse applied to one of said first and second input lines;
a first coincidence gate having a first input terminal connected to said first input line and a second input terminal connected to an output terminal of said first bistable element for generating an output pulse in response to the leading edge transition of a pulse applied to said first input line when said pulse and a preceding pulse applied to said frst input line occur during the interval between successive pulses applied to said second input line;
a second coincidence gate having a first input terminal connected to said second input line and a second input terminal connected to an output terminal of said first bistable element for generating an output pulse in response to the leading edge transition of a pulse supplied to said second input line when said pulse and a preceding pulse supplied to said second input line occur during the interval between successive pulses supplied to said first input line;

a second bistable element having a set input terminal connected to the output terminal of said first coincidence gate and a reset input terminal connected to the output terminal of said second coincidence gate for generating an output signal representative of the difference in frequency between pulses applied to said first and second input lines;

delay means for completing the resetting operation of said first bistable element after the trailing edge transition of a pulse supplied to one of said first and second input lines.

30. A frequency-phase comparator as claimed in claim 29, wherein said delay means comprises a fourth bistable element having a set input terminal connected to said first input line and a reset input terminal connected to said second input line to repeatedly change its binary output state in response to the leading edge transition of said effective pulse supplied to said first and second input lines; a third coincidence gate having a first input terminal connected to said first input line and a second input terminal connected to an output terminal of said fourth bistable element for setting said third bistable element in response to the trailing edge transition of said effective pulse supplied to said first input line; and a fourth coincidence gate having a first input terminal connected to said second input line and a second input terminal connected to an output terminal of said fourth bistable element for resetting said third bistable element in response to the trailing edge transition of said effective pulse supplied to said second input line.

31. A frequency-phase comparator as claimed in claim 29, wherein said delay means comprises a pair of third and fourth coincidence gates which are so cross-coupled that the output terminal of each is connected to a first input terminal of the other, said third coincidence gate having a second input terminal connected to said first input line and said fourth coincidence gate having a second input terminal connected to said second input line; a fifth coincidence gate having a first input terminal connected to said second input line, a second input terminal connected to an output terminal of said third bistable element, and an output terminal connected to a third input terminal of said third coincidence gate; and a sixth coincidence gate having a first input terminal connected to said first input line, a second input terminal to an output terminal of said third bistable element, and an output terminal connected to a third input terminal of said fourth coincidence gate.

32. A frequency-phase comparator having first and second input lines to which input pulses are supplied, comprising:

a first bistable element arranged to repeatedly change its binary output state in response to said input pulses when the input pulses supplied to said first input line occur alternately with the input pulses supplied to said second input line;

a first coincidence gate having a first input terminal connected to said first input line and a second input terminal connected to an output terminal of said first bistable element for generating an output signal in response to the leading edge trnsition of an ineffective input pulse supplied to said first input line without causing said first bistable element to change its binary output state;

a second coincidence gate having a first input terminal connected to said second input line and a second input terminal connected to an output terminal of said first bistable element for generating an output signal in response to the leading edge transition of an ineffective input pulse supplied to said second input line without causing said first bistable element to change its binary output state;

a second bistable element having a set input terminal connected to the output terminal of said first coincidence gate and a reset input terminal connected to the output terminal of said second coincidence gate;

delay means for completing the resetting operation of said first bistable element after the trailing edge transition of an effective input pulse supplied to said first or second input line causing said first bistable element to change its binary state; and combining means for combining output signals from said first and second bistable elements.

33. A frequency-phase comparator as claimed in claim 32, wherein said delay means comprises a fourth bistable element having a set input terminal connected to said first input line and a reset input terminal connected to said second input line to repeatedly change its binary output state in response to the leading edge transition of said effective pulse supplied to said first and second input lines; a third coincidence gate having a first input terminal connected to said first input line and a second input terminal connected to an output terminal of said fourth bistable element for setting said third bistable element in response to the trailing edge transition of said effective pulse supplied to said first input line; and a fourth coincidence gate having a first input terminal connected to said second input line and a second input terminal connected to an output terminal of said fourth bistable element for resetting said third bistable element in response to the trailing edge transition of said effective pulse supplied to said second input line.

34. A frequency-phase comparator as claimed in claim 32, wherein said delay means comprises a pair of third and fourth coincidence gates which are so cross-coupled that the output terminal of each is connected to a first input terminal of the other, said third coincidence gate having a second input terminal connected to said first input line and said fourth coincidence gate having a second input terminal connected to said second input line; a fifth clockwise gate having a first input terminal connected to said second input line, a second input terminal connected to an output terminal of said third bistable element, and an output terminal connected to a third input terminal of said third coincidence gate; and a sixth coincidence gate having a first input terminal connected to said first input line, a second input terminal connected to an output terminal of said third bistable element, and an output terminal connected to a third input terminal of said fourth coincidence gate.

35. A frequency-phase comparator having first and second input lines to which input pulses are supplied, comprising:

a first bistable element having a set input terminal connected to said first input line and a reset input terminal connected to said second input line;

a second bistable element;

a first coincidence gate having a first input terminal connected to said first input line and a second input terminal connected to an output terminal of said first bistable element for setting said second bistable element in response to the trailing edge transition of an effective input pulse supplied to said first input line causing said first bistable element to change its binary output state;

a second coincidence gate having input terminals connected respectively to said second input line and to an output terminal of said first bistable element for resetting said second bistable element in response to the trailing edge transition of an effective input pulse supplied to said second input line causing said first bistable element to change its binary output state;

a third coincidence gate having input terminals connected respectively to said second input line and to an output terminal of said second bistable element for generating an output signal in response to the leading edge transition of an ineffective input pulse supplied to said first input line without causing said second bistable element to change its binary output state;

a fourth coincidence gate having input terminal connected respectively to said second input line and to an output terminal of said second bistable element for generating an output signal in response to the leading edge transition of an ineffective input pulse supplied to said second input line without causing said second bistable element to change its binary output state;

a third bistable element having a set input terminal connected to the output terminal of said third coincidence gate and a reset input terminal connected to the output terminal of said fourth coincidence gate; and combining means for combining output signals from said first and third bistable elements.

36. A frequency-phase comparator having first and second input lines to which input pulses are supplied, comprising:

a first bistable element comprising a pair of first and second coincidence gates which are so cross-coupled that the output terminal of each is connected to a first input terminal of the other, said first coincidence gate having a second input terminal connected to said first input line and said second coincidence gate having a second input terminal connected to said second input line;

a third coincidence gate having input terminals respectively connected to said second input line and to an output terminal of said first bistable element and an output terminal connected to an input terminal of said first coincidence gate;

a fourth coincidence gate having input terminals respectively connected to said first input line and to an output terminal of said first bistable element and an output terminal connected to an input terminal of said second coincidence gate;

a second bistable element having set and reset input terminals;

a fifth coincidence gate having input terminals respectively connected to said first input line and to an output terminal of said first bistable element and an output terminal connected to the set input terminal of said second bistable element;

a sixth coincidence gate having input terminals respectively connected to said second input line and to an output terminal of said first bistable element and an output terminal connected to the reset input terminal of said second bistable element;

a seventh coincidence gate having input terminals respectively connected to the output terminal of one of said third and fourth coincidence gates and to an output terminal of said second bistable element; and means connected to the output terminal of said seventh coincidence gate for deriving an output signal representative of the difference in phase and frequency between said input pulses supplied to said first and second input lines.

* * * * *